US012757728B2

(12) United States Patent
Cheng et al.

(10) Patent No.: US 12,757,728 B2
(45) Date of Patent: Oct. 6, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Chung-Liang Cheng, Changhua City (TW); Guanyu Luo, Chiayi County (TW); Sheng-Chan Li, Tainan City (TW); Sheng-Chau Chen, Tainan City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 657 days.

(21) Appl. No.: 18/185,587

(22) Filed: Mar. 17, 2023

(65) Prior Publication Data

US 2024/0312906 A1 Sep. 19, 2024

(51) Int. Cl.
*H10W 20/40* (2026.01)
*H10P 50/00* (2026.01)
(Continued)

(52) U.S. Cl.
CPC ........... *H10W 20/498* (2026.01); *H10P 50/73* (2026.01); *H10W 20/057* (2026.01);
(Continued)

(58) Field of Classification Search
CPC ............. H01L 23/5226; H01L 23/5228; H01L 23/76852; H01L 23/53266; H01L 21/31144; H01L 21/76816; H01L 21/76832; H01L 21/76879; H01L 21/28562; H01L 21/76805; H01L 21/76852; H01L 21/76885; H10D 1/474; H10W 20/498; H10W 20/057; H10W 20/075; H10W 20/089; H10W 20/42;
(Continued)

(56) References Cited

U.S. PATENT DOCUMENTS 8,193,603 B2 * 6/2012 Klatt .................. H01L 23/5223
257/532
8,553,445 B2 * 10/2013 Baek ..................... G11C 5/025
365/163
(Continued)

*Primary Examiner* — Dale E Page
*Assistant Examiner* — Quovaunda Jefferson
(74) *Attorney, Agent, or Firm* — Harrity & Harrity, LLP

(57) ABSTRACT

A sealing layer is formed around a contact structure of a resistor in a semiconductor device. The sealing layer fills in and occupies areas around the contact structure in which an overhang of a hard mask layer occurs as a result of lateral etching of the contact structure during formation of the contact structure. The sealing layer may include a material that can be selectively deposited on sidewalls of the contact structure and not on other layers and/or structures in the semiconductor device. The sealing layer may reduce the likelihood of void formation, in a dielectric layer, that might otherwise occur due to the overhang of the hard mask layer. The reduced likelihood of void formation may enable the dielectric layer to fully fill in the areas around the resistor in the semiconductor device, thereby increasing the structural integrity of the semiconductor device.

20 Claims, 22 Drawing Sheets

(51) Int. Cl.

| | |
|---|---|
| ***H10W 20/00*** | (2026.01) |
| ***H10W 20/41*** | (2026.01) |
| ***H10W 20/42*** | (2026.01) |

(52) U.S. Cl.
CPC ....... *H10W 20/075* (2026.01); *H10W 20/089* (2026.01); *H10W 20/42* (2026.01); *H10W 20/425* (2026.01)

(58) Field of Classification Search
CPC ........... H10W 20/425; H10W 20/0633; H10W 20/039; H10W 20/063; H10W 20/083; H10P 50/73; H10P 14/432
See application file for complete search history.

(56) References Cited

U.S. PATENT DOCUMENTS

| | | | | |
|---|---|---|---|---|
| 2007/0176295 | A1 * | 8/2007 | Chinthakindi ......... | H10D 88/00<br>438/666 |
| 2023/0063793 | A1 * | 3/2023 | Hsu ........................ | H10D 88/00 |

* cited by examiner

SEMICONDUCTOR DEVICE AND METHODS OF FORMATION

BACKGROUND

Semiconductor-based integrated circuits may include a wide range of semiconductor devices. These semiconductor devices may include active semiconductor devices and/or passive semiconductor devices. Active semiconductor devices may include transistors and other semiconductor devices that operate using a power source. Passive semiconductor devices include inductors, capacitors, resistors, and/or other semiconductor devices that can operate without a power source. Resistors are widely used in many applications such as resistor-capacitor (RC) circuits, power drivers, power amplifiers, and/or radio frequency (RF) applications, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
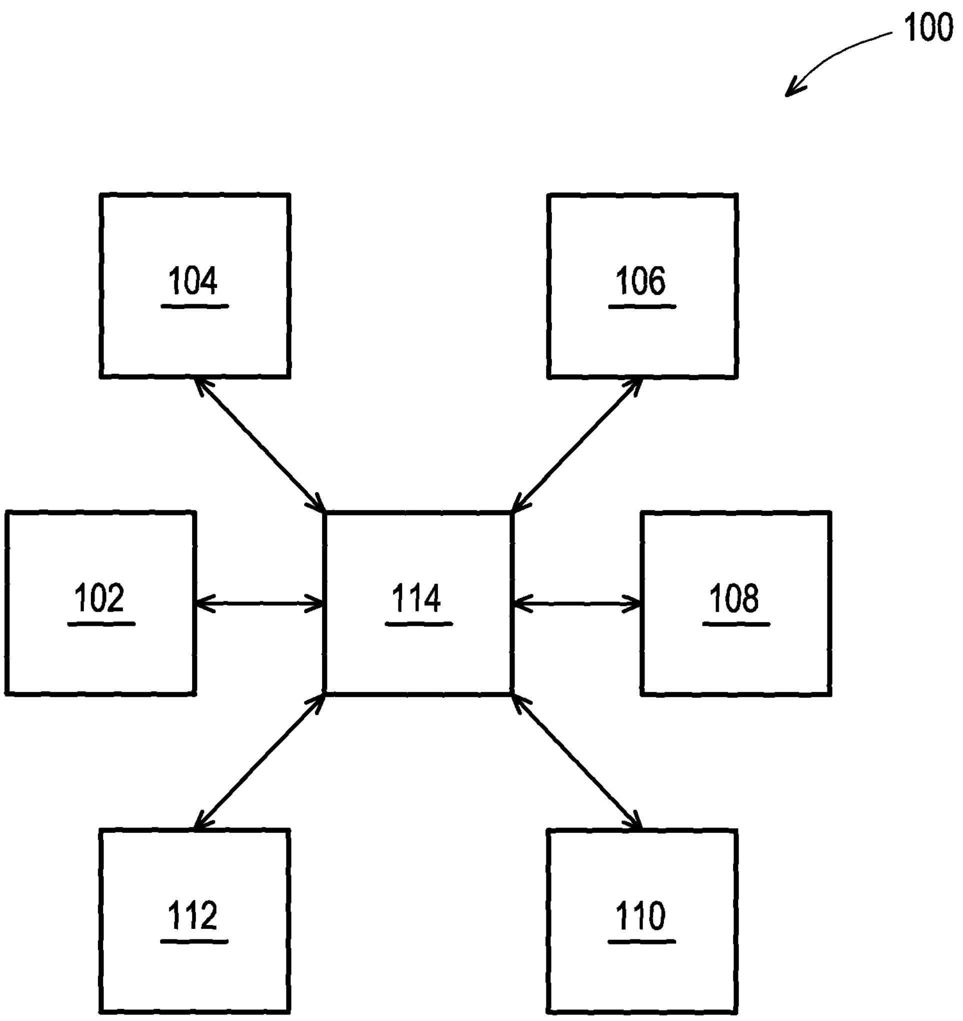
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a resistor may be formed in a back end of line (BEOL) region of a semiconductor device. A resistive layer of the resistor may be formed in a dielectric layer of the BEOL region. Contact structures for the resistor may be formed over the resistive layer is formed over the resistive layer and capping layers are formed over the contact structures. Forming the contact structures may include depositing a layer of conductive material over the resistive layer and removing portions of the layer of conductive material by etching. Remaining portions of the layer of conductive material may correspond to the contact structures.

A masking layer, such as a hard mask and/or a photoresist, may be used to etch the layer of conductive material to form the contact structures. In some cases, lateral etching of the contact structures may occur, where a width of a contact structure is reduced. Lateral etching results in an overhang of the masking layer, where the masking layer extends laterally outward past the contact structure. The overhang of the masking layer may result in the formation of voids in the dielectric layer around the contact structures. These voids may reduce the structural integrity of the BEOL region, and may cause portions of the BEOL region to collapse and fail. This may result in reduced functionality and/or reduce performance for the semiconductor device in that collapse and/or failure in the BEOL region may result in non-functional components in the semiconductor device. Moreover, this may result in reduced semiconductor device yield in that semiconductor devices with collapsed and/or failed BEOL region portions may not satisfy design and/or production parameters and may be scrapped as a result.

In some implementations described herein, a sealing layer is formed around a contact structure of a resistor in a BEOL region of a semiconductor device. The sealing layer fills in and occupies areas around the contact structure in which an overhang of a hard mask layer occurs as a result of lateral etching of the contact structure during formation of the contact structure. The sealing layer may include tungsten (W), molybdenum (Mo), and/or another material that can be selectively deposited on sidewalls of the contact structure and not on other layers and/or structures in the BEOL region.

The sealing layer described herein may reduce the likelihood of void formation, in a dielectric layer of the BEOL region, that might otherwise occur due to the overhang of the hard mask layer. The reduced likelihood of void formation may enable the dielectric layer to fully fill in the areas around the resistor in the BEOL region, thereby increasing the structural integrity of the BEOL region. The increased structural integrity may reduce the likelihood of portions of the BEOL region collapsing and/or failing. Thus, the increased structural integrity may preserve functionality and/or increase performance for the semiconductor device in that the likelihood of component failure in the semiconductor device is reduced as a result of the reduced likelihood of portions of the BEOL region collapsing and/or failing. This may increase yield of semiconductor devices that include sealing layers described herein.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may remove portions of a hard mask layer to form a pattern in the hard mask layer, where remaining portions of the hard mask layer correspond to a capping layer of a semiconductor resistor structure; may etch a conductive layer below the hard mask layer to form a contact structure of the semiconductor resistor structure under the hard mask layer, where a sidewall of the contact structure is laterally etched, thereby resulting in an overhang region around the contact structure in which the capping layer extends laterally outward past the sidewall of the contact structure; may form a sealing layer on the sidewall of the contact structure, where the sealing layer occupies the overhang region around the contact structure; and/or may form, after forming the sealing layer, a dielectric layer over and around the semiconductor resistor structure. In some implementations, one or more of the semiconductor processing tools 102-112 and/or the wafer/die transport tool 114 may perform one or more operations described in connection with FIGS. 2, 3, 4, 5, 6, 7, 8A-8L, and/or 9, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
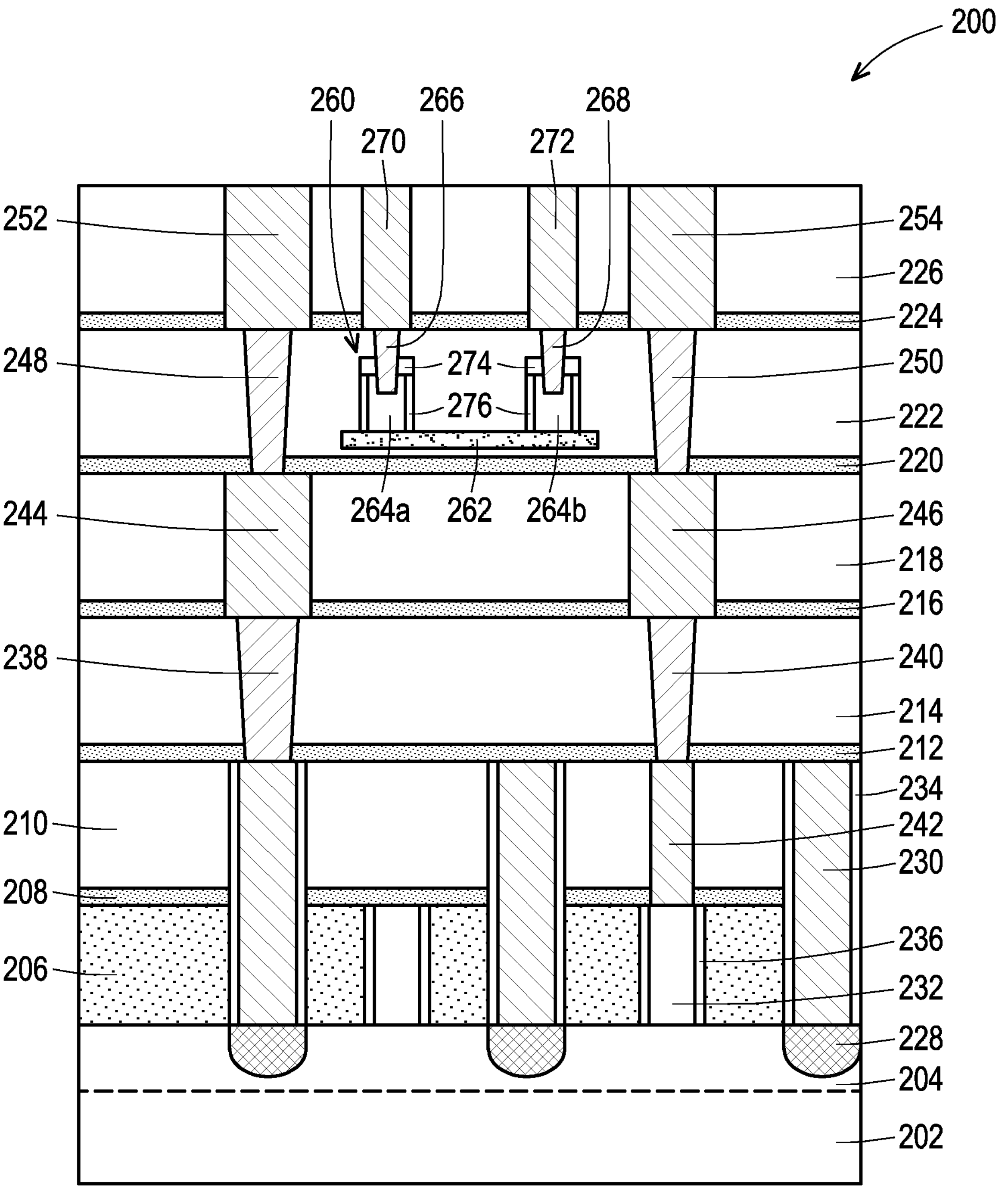
FIG. 2 is a diagram of a portion of an example semiconductor device described herein.

FIG. 2 is a diagram of a portion of an example semiconductor device 200 described herein. The semiconductor device 200 includes an example of a semiconductor device, such as a semiconductor memory device (e.g., a static random access memory (SRAM), a dynamic random access memory (DRAM)), a semiconductor logic device, a processor, an input/output device, or another type of semiconductor device that includes one or more transistors.

The semiconductor device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the semiconductor device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the semiconductor device 200 (or the layers included therein) to be selectively etched or protected from etching to form one or more of the structures included in the semiconductor device 200.

As further shown in FIG. 2, the semiconductor device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the semiconductor device 200.

The epitaxial regions 228 are electrically connected to metal source or drain contacts 230 of the transistors included in the semiconductor device 200. The metal source or drain contacts (MDs or CAs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the semiconductor device 200 and/or electrically connect the transistors to other areas and/or components of the semiconductor device 200. In some implementations, the interconnects electrically connect the transistors to a back end of line (BEOL) region of the semiconductor device 200.

The metal source or drain contacts 230 are electrically connected to source or drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the semiconductor device 200 includes additional metallization layers and/or vias that connect the semiconductor device 200 to a package. The BEOL region of the semiconductor device 200 may refer to the region of the semiconductor device 200 above the ESL 208, including the structures/layers 210-226 and 238-254.

As further shown in FIG. 2, the semiconductor device 200 may include one or more devices and/or structures in the BEOL region of the semiconductor device 200. For example, the semiconductor device 200 may include one or more semiconductor resistor structures 260 in the BEOL region of the semiconductor device 200. The semiconductor resistor structure 260 may be included in one or more of the dielectric layers 210, 214, 218, 222, and/or 226 in the BEOL region of the semiconductor device 200. Accordingly, the semiconductor resistor structure 260 may be referred to as a BEOL resistor structure or a thin-film BEOL resistor structure, among other examples.

The semiconductor resistor structure 260 includes a resistive layer 262. The resistive layer 262 may include one or more materials configured to provide electrical resistance. In some implementations, the resistive layer 262 includes silicon chromium (SiCr) resistive material. Silicon chromium resistive material may provide a reduced temperature coefficient of resistance (TCR) relative to other types of resistive material (e.g., polysilicon resistive materials). The reduced TCR may result in reduce changes in resistance in the semiconductor resistor structure 260, relative to a semiconductor resistor structure that includes polysilicon resistive materials, due to heat. In some implementations, a thickness of the resistive layer 262 may be included in a range of approximately 50 angstroms to approximately 600 angstroms. However, other values for the range are within the scope of the present disclosure.

The semiconductor resistor structure 260 includes contact structures **264*a* and 264*b* over and/or on the resistive layer 262. The contact structures 264*a* and 264*b* are electrically connected with the resistive layer 262 and provide an input to, and an output from, the resistive layer 262. Thus, the contact structures 264*a* and 264*b* function as the terminals of the semiconductor resistor structure 260. The contact structures 264*a* and 264*b* may each include one or more electrically conductive materials, such as titanium nitride (TiN), a ceramic material, a metal material, a metal alloy, and/or another electrically conductive material, among other examples. The contact structures 264*a* and 264*b* may be spaced apart by the dielectric layer 222 such that the contact structures 264*a* and 264*b* are electrically isolated to reduce the likelihood of electrical shorting between the contact structures 264*a* and 264*b*. In some implementations, a thickness of the contact structures 264*a* and 264*b*** is included in a range of approximately 650 angstroms to approximately 850 angstroms. However, other values for the range are within the scope of the present disclosure.

The contact structure **264*a* may be physically coupled and/or electrically coupled with a via 266 and/or another type of BEOL interconnect structure. The contact structure 264*b* may be physically coupled and/or electrically coupled with a via 268 and/or another type of BEOL interconnect structure. The via 266 may be physically coupled and/or electrically coupled with a conductive structure 270 and/or another type of BEOL metallization layer. The via 268 may be physically coupled and/or electrically coupled with a conductive structure 272 and/or another type of BEOL metallization layer. The vias 266 and 268, and/or the conductive structures 270 and 272, may include materials similar to those included in one or more of the BEOL structures 238-254. The vias 266 and 268 may be included in the dielectric layer 222 and may respectively extend into a portion of the contact structures 264*a* and 264*b*. The conductive structures 270 and 272 may be included in the dielectric layer 226 and may be extend through the ESL 224. In some implementations, the conductive structures 270 and 272 are top metal layers in the semiconductor device 200**.

Capping layers 274 may be included over and/or on the contact structures **264*a* and 264*b*. The vias 266 and 268 may extend through the capping layers 274. The capping layers 274 may include a silicon nitride ($Si_xN_y$), a silicon oxynitride (SiON), a high dielectric constant (high-K) dielectric material, and/or another suitable dielectric material that may provide electrical isolation for top surfaces of the contact structures 264*a* and 264*b*. The capping layers 274 may also be used as a hard mask layer for patterning the contact structures 264*a* and 264*b* during fabrication/formation of the semiconductor resistor structure 260. In some implementations, a thickness of the capping layers 274** may be included in a range of approximately 300 angstroms to approximately 400 angstroms. However, other values for the range are within the scope of the present disclosure.

The semiconductor resistor structure 260 may include sealing layers 276 around the contact structures **264*a* and 264*b*. The sealing layers 276 may be included on sidewalls of the contact structures 264*a* and 264*b* and may extend between the resistive layer 262 and the capping layers 274. The sealing layers 276 may occupy portions of the semiconductor resistor structure 260 in which an overhang of a capping layer 274 over an associated contact structure (e.g., the contact structure 264*a*, the contact structure 264*b*) occurs. In other words, a sealing layer 276 may be included under a portion of a capping layer 274** that extends laterally outward from an underlying contact structure.

A sealing layer 276 may be included around a contact structure to reduce or substantially eliminate the likelihood of void formation in the dielectric layer 222 when the dielectric layer 222 is filled in around the semiconductor resistor structure 260. Without the sealing layers 276 described herein, voids may form in the portions of the semiconductor resistor structure 260 in which an overhang of a capping layer 274 over an associated contact structure occurs. The voids may occur due to the difficulty in providing a lateral flow of dielectric material into the portions of the semiconductor resistor structure 260 in which an overhang of a capping layer 274 over an associated contact structure occurs using the bulk deposition techniques that may be used to deposit the material of the dielectric layer 222.

As described in connection with FIGS. 8A-8L, the sealing layers 276 may be selectively formed on the sidewalls of the contact structures **264*a* and 264*b* such that the material of the sealing layer 276 is not deposited on other surfaces of the semiconductor resistor structure 260, such as a top surface of the resistive layer 262. The sealing layers 276 may include a material that selectively bonds or adheres to the material of the contact structures 264*a* and 264*b*, and resists bonding with or adhering to the material of the resistive layer 262 and other layers/structures of the semiconductor resistor structure 260. Examples of materials for the sealing layers 276 that enable selective deposition of the sealing layers 276** may include tungsten (W), molybdenum (Mo), and/or another suitable material.

As indicated above, FIG. 2 is provided as an example. Other examples may differ from what is described with regard to FIG. 2.

Figure 3:
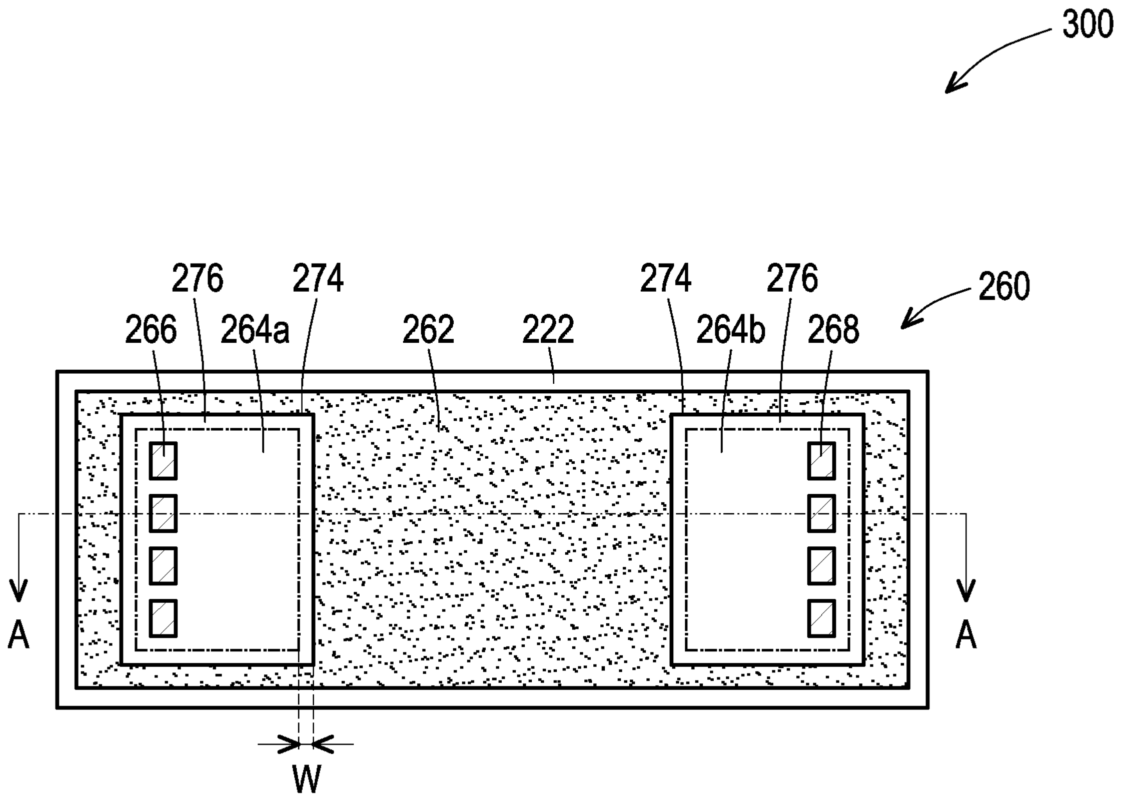
FIG. 3 is a diagram of an example implementation of the semiconductor resistor structure described herein.

FIG. 3 is a diagram of an example implementation 300 of the semiconductor resistor structure 260 described herein. FIG. 3 illustrates a top-down view of the semiconductor resistor structure 260. FIG. 3 further illustrates a reference cross-section A-A that are used in later figures, including FIGS. 4, 5, 6, 7, and/or 8A-8L. Cross-section A-A is in a plane along the resistive layer 262 and includes the contact structures 264*a* and 264*b*. Some structures/layers are illustrated in dashed lines as an indication that those structures/layers are located under one or more other structures/layers in the semiconductor resistor structure 260. Moreover, the dielectric layer 222 is shown as being under the resistive layer 262 only for purposes of clarity in illustrating the structures/layers of the semiconductor resistor structure 260. It is to be understood that the dielectric layer 222 covers the structures/layers of the semiconductor resistor structure 260.

As shown in FIG. 3, the contact structures 264*a* and 264*b* may be located at opposing ends of the resistive layer 262. A plurality of vias 266 may penetrate through a capping layer 274 over and/or on the contact structure 264*a* and into a portion of the contact structure 264*a*. A plurality of vias 268 may penetrate through a capping layer 274 over and/or on the contact structure 264*b* and into a portion of the contact structure 264*b*.

As further shown in FIG. 3, the contact structure 264*a* may be surrounded by a sealing layer 276. The sealing layer 276 may be included around the perimeter of the contact structure 264*a* (e.g., included on four sides of the contact structure 264*a*). The sealing layer 276 around the contact structure 264*a* may be located under the capping layer 274 that is located over and/or on the contact structure 264*a*.

A width W of the sealing layer 276 around the contact structure 264*a* may be based on an amount of overhang of the capping layer 274 over and/or on the contact structure 264*a*. For example, the width W of the sealing layer 276 may be approximately equal to the amount of overhang of the capping layer 274. In other words, the sealing layer 276 around the contact structure 264*a* extends laterally outward from the contact structure 264*a* approximately the same distance as the capping layer 274 over and/or on the contact structure 264*a* extends laterally outward from the contact structure 264*a*. In some implementations, the width W of the sealing layer 276 is included in a range of approximately 500 angstroms to approximately 1500 angstroms such that the sealing layer 276 fully fills in and occupies the area of overhang around the contact structure 264*a*.

The contact structure 264*b* may be surrounded by a sealing layer 276. The sealing layer 276 may be included around the perimeter of the contact structure 264*b* (e.g., included on four sides of the contact structure 264*b*). The sealing layer 276 around the contact structure 264*b* may be located under the capping layer 274 that is located over and/or on the contact structure 264*b*.

A width W of the sealing layer 276 around the contact structure 264*b* may be based on an amount of overhang of the capping layer 274 over and/or on the contact structure 264*b*. For example, the width W of the sealing layer 276 may be approximately equal to the amount of overhang of the capping layer 274. In other words, the sealing layer 276 around the contact structure 264*b* extends laterally outward from the contact structure 264*b* approximately the same distance as the capping layer 274 over and/or on the contact structure 264*b* extends laterally outward from the contact structure 264*b*. In some implementations, the width W of the sealing layer 276 is included in a range of approximately 500 angstroms to approximately 1500 angstroms such that the sealing layer 276 fully fills in and occupies the area of overhang around the contact structure 264*b*.

As indicated above, FIG. 3 is provided as an example. Other examples may differ from what is described with regard to FIG. 3.

Figure 4:
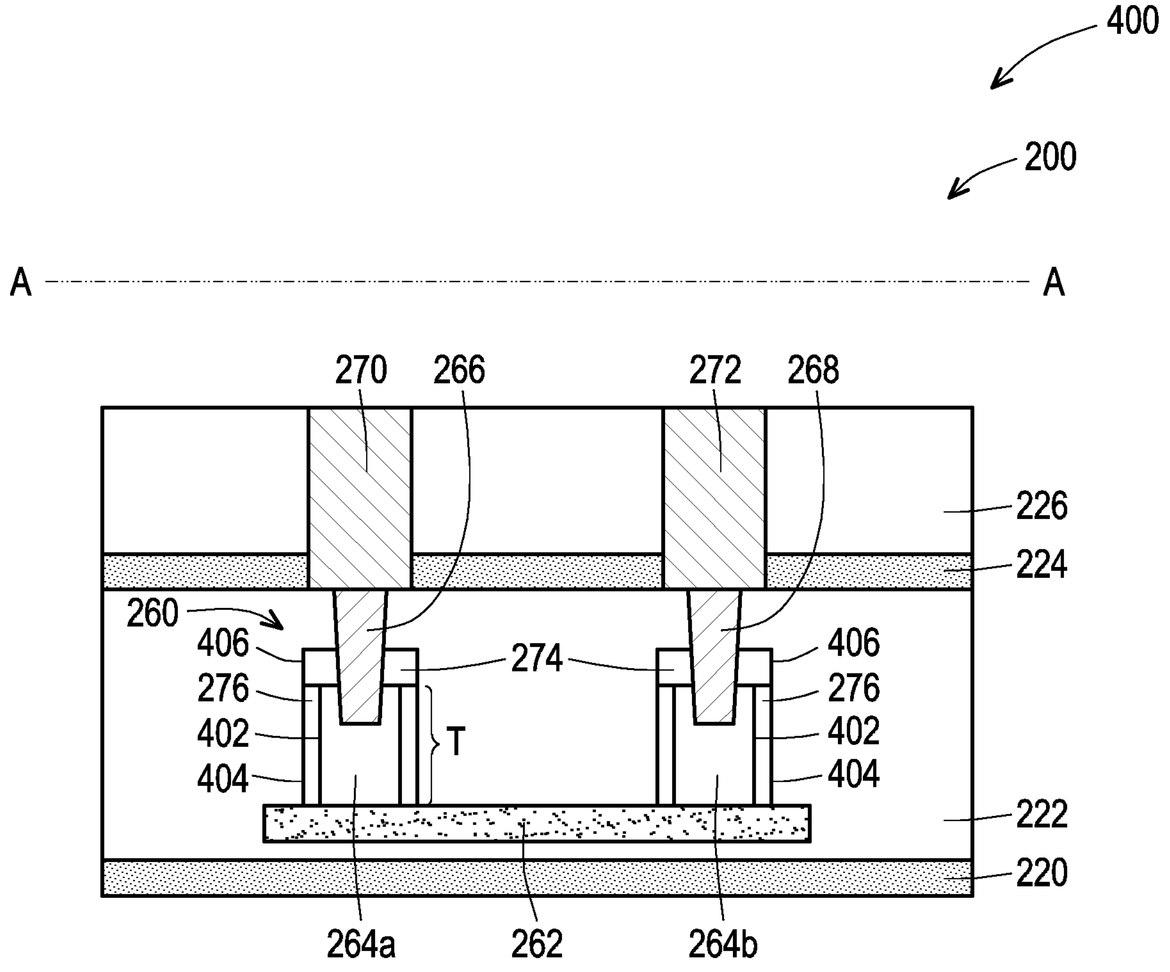
FIG. 4 is a diagram of an example implementation of the semiconductor resistor structure described herein.

FIG. 4 is a diagram of an example implementation 400 of the semiconductor resistor structure 260 described herein. FIG. 4 illustrates a cross-section view of the semiconductor resistor structure 260 in the cross-section A-A illustrated in FIG. 3.

The semiconductor resistor structure 260 may be included in a portion of the semiconductor device 200, such as in the BEOL region of the semiconductor device 200. In some implementations, the semiconductor resistor structure 260 may be included in the dielectric layer 222, which is included over and/or on the ESL 220. The ESL 224 is included over and/or on the dielectric layer 222, and the dielectric layer 226 is included over and/or on the ESL 224.

The semiconductor resistor structure 260 may include the resistive layer 262, the contact structures 264*a* and 264*b*. The contact structure 264*a* is physically coupled and/or electrically coupled with the via 266, and the via 266 is physically coupled and/or electrically coupled with the conductive structure 270. The contact structure 264*b* is physically coupled and/or electrically coupled with the via 268, and the via 268 is physically coupled and/or electrically coupled with the conductive structure 272.

Capping layers 274 may be included over and/or on the contact structures 264*a* and 264*b*. Sealing layers 276 may be included on sidewalls of the contact structures 264*a* and 264*b*, and may be included around the perimeters of the contact structures 264*a* and 264*b*.

A sealing layer 276 may extend along the sidewall of the contact structure 264*a* between the resistive layer 262 and the capping layer 274 over and/or on the contact structure 264*a*. Thus, a thickness T of the sealing layer 276 may be approximately equal to a thickness of the contact structure 264*a*. In other words, the thickness T of the sealing layer 276 and the thickness of the contact structure 264*a* are approximately a same thickness. Accordingly, the thickness T of the sealing layer 276 around the contact structure 264*a* may be included in a range of approximately 650 angstroms to approximately 850 angstroms to ensure that the sealing layer 276 is continuous along the sidewall of the contact structure 264*a* between the resistive layer 262 and the capping layer 274 to reduce or prevent the likelihood of void formation around the contact structure 264*a*. However, other values for the range are within the scope of the present disclosure. The sealing layer 276 extending between the resistive layer 262 and the capping layer 274 over and/or on the contact structure 264*a* results in a height of a top surface of the sealing layer 276 in the semiconductor device 200 being greater relative to a height of a bottom surface of the via 266 in the semiconductor device 200.

The sealing layer 276 around the contact structure 264*a* may have an inner sidewall 402 and an outer sidewall 404. An inner sidewall 402 of the sealing layer 276 may interface with a sidewall of the contact structure 264*a*, and may therefore conform to a profile of the sidewall of the contact structure 264*a*. An outer sidewall 404 of the sealing layer 276 may be approximately parallel with the inner sidewall 402, and may be approximately parallel with an outer sidewall 406 of a capping layer 274 over and/or on the contact structure 264*a*. Thus, the sealing layer 276 may have a uniform and approximately equal width W along the profile of the sealing layer 276 between the resistive layer 262 and the capping layer 274 over and/or on the contact structure 264*a*.

A sealing layer 276 may extend along the sidewall of the contact structure 264*b* between the resistive layer 262 and the capping layer 274 over and/or on the contact structure 264*b*. Thus, a thickness T of the sealing layer 276 may be approximately equal to a thickness of the contact structure 264*b*. Accordingly, the thickness T of the sealing layer 276 around the contact structure 264*b* may be included in a range of approximately 650 angstroms to approximately 850 angstroms to ensure that the sealing layer 276 is continuous along the sidewall of the contact structure 264*b* between the resistive layer 262 and the capping layer 274 to reduce or prevent the likelihood of void formation around the contact structure 264*b*. However, other values for the range are within the scope of the present disclosure. The sealing layer 276 extending between the resistive layer 262 and the capping layer 274 over and/or on the contact structure 264*b* results in a height of a top surface of the sealing layer 276 in the semiconductor device 200 being greater relative to a height of a bottom surface of the via 268 in the semiconductor device 200.

An inner sidewall 402 of the sealing layer 276 around the contact structure 264*b* may interface with a sidewall of the contact structure 264*b*, and may therefore conform to a profile of the sidewall of the contact structure 264*b*. An outer sidewall 404 of the sealing layer 276 may be approximately parallel with the inner sidewall 402, and may be approximately parallel with an outer sidewall 406 of a capping layer 274 over and/or on the contact structure 264*b*. Thus, the sealing layer 276 may have a uniform and approximately equal width W along the profile of the sealing layer 276 between the resistive layer 262 and the capping layer 274 over and/or on the contact structure 264*b*.

As indicated above, FIG. 4 is provided as an example. Other examples may differ from what is described with regard to FIG. 4.

Figure 5:
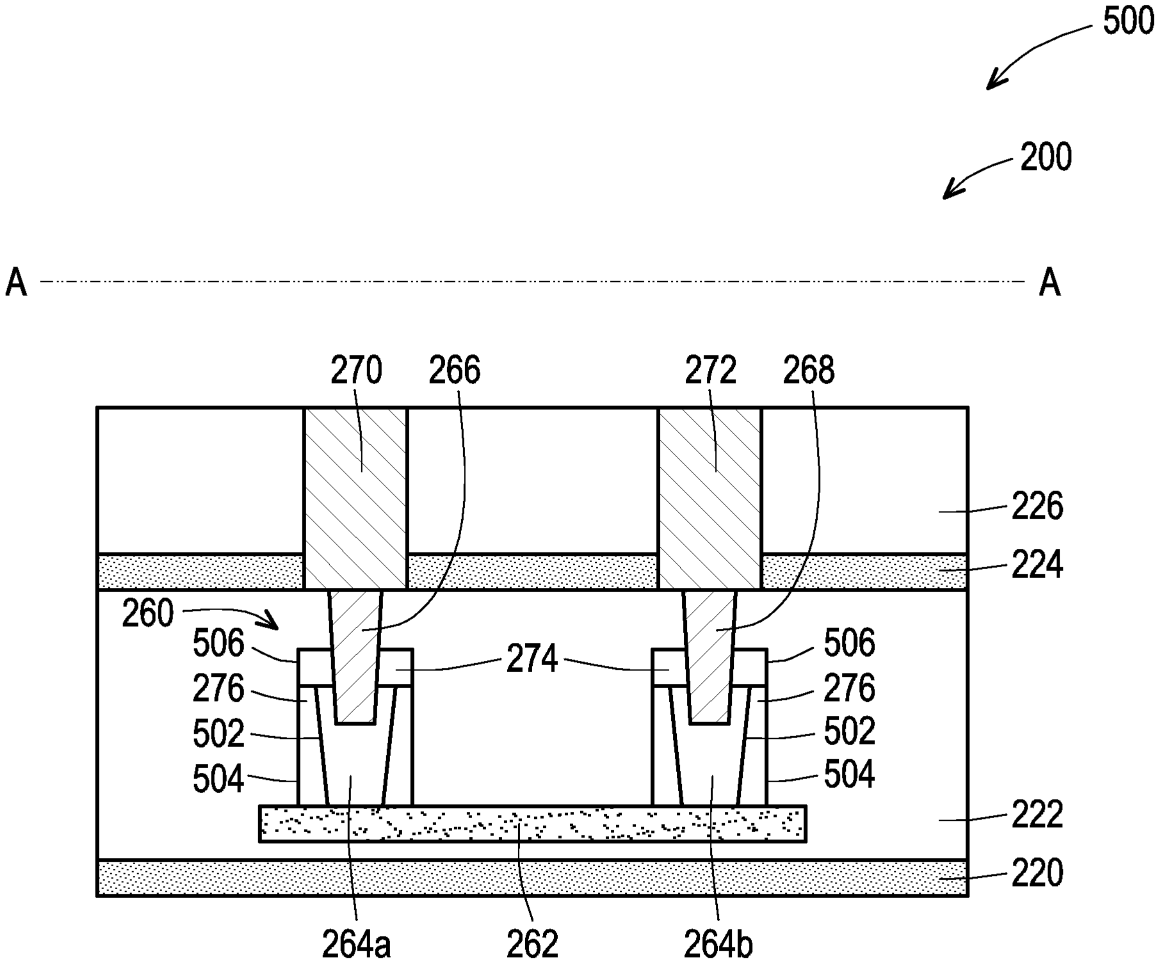
FIG. 5 is a diagram of an example implementation of the semiconductor resistor structure described herein.

FIG. 5 is a diagram of an example implementation 500 of the semiconductor resistor structure 260 described herein. FIG. 5 illustrates a cross-section view of the semiconductor resistor structure 260 in the cross-section A-A illustrated in FIG. 3. As shown in FIG. 5, the example implementation 500 may include elements 220-226 and 260-272 similar to the example implementation 400. However, in the example implementation 500, the sealing layers 276 around one or more of the contact structure 264*a* and/or 264*b* may include at least one tapered sidewall. The tapered sidewall may result from a sealing layer 276 conforming to a cross-sectional profile of the contact structure 264*a* and/or 264*b*.

The sealing layer 276 around the contact structure 264*a* may have an inner sidewall 502 and an outer sidewall 504. The inner sidewall 502 of the sealing layer 276 may interface with a sidewall of the contact structure 264*a*, and may therefore conform to a profile of the sidewall of the contact structure 264*a*. The contact structure 264*a* may have a tapered cross-sectional profile resulting in a width of the contact structure 264*a* that decreases from the capping layer 274 over and/or on the contact structure 264*a* to the resistive layer 262. The inner sidewall 502 may conform to the taper of the sidewall of the contact structure 264*a*. The tapered cross-sectional profile of the contact structure 264*a* may result from a type of etchant used to form the contact structure 264*a*, a type of etch technique used to form the contact structure 264*a*, one or more processing parameters (e.g., plasma type, plasma bias, isotropic or anisotropic etch, pressure, temperature) used to form the contact structure 264*a*, and/or another factor.

The outer sidewall 504 of the sealing layer 276 may be approximately parallel with an outer sidewall 506 of a capping layer 274 over and/or on the contact structure 264*a*. Thus, the sealing layer 276 may have a tapered cross-sectional profile resulting in a width W that increases from the capping layer 274 to the resistive layer 262 (e.g., and decreases from the resistive layer 262 to the capping layer 274).

The sealing layer 276 around the contact structure 264*b* may have an inner sidewall 502 and an outer sidewall 504. The inner sidewall 502 of the sealing layer 276 may interface with a sidewall of the contact structure 264*b*, and may therefore conform to a profile of the sidewall of the contact structure 264*b*. The contact structure 264*b* may have a tapered cross-sectional profile resulting in a width of the contact structure 264*b* that decreases from the capping layer 274 over and/or on the contact structure 264*b* to the resistive layer 262. The inner sidewall 502 may conform to the taper of the sidewall of the contact structure 264*b*. The tapered cross-sectional profile of the contact structure 264*b* may result from a type of etchant used to form the contact structure 264*b*, a type of etch technique used to form the contact structure 264*b*, one or more processing parameters (e.g., plasma type, plasma bias, isotropic or anisotropic etch, pressure, temperature) used to form the contact structure 264*b*, and/or another factor.

The outer sidewall 504 of the sealing layer 276 may be approximately parallel with an outer sidewall 506 of a capping layer 274 over and/or on the contact structure 264*b*. Thus, the sealing layer 276 may have a tapered profile resulting in a width W that increases from the capping layer 274 to the resistive layer 262 (e.g., and decreases from the resistive layer 262 to the capping layer 274).

As indicated above, FIG. 5 is provided as an example. Other examples may differ from what is described with regard to FIG. 5.

Figure 6:
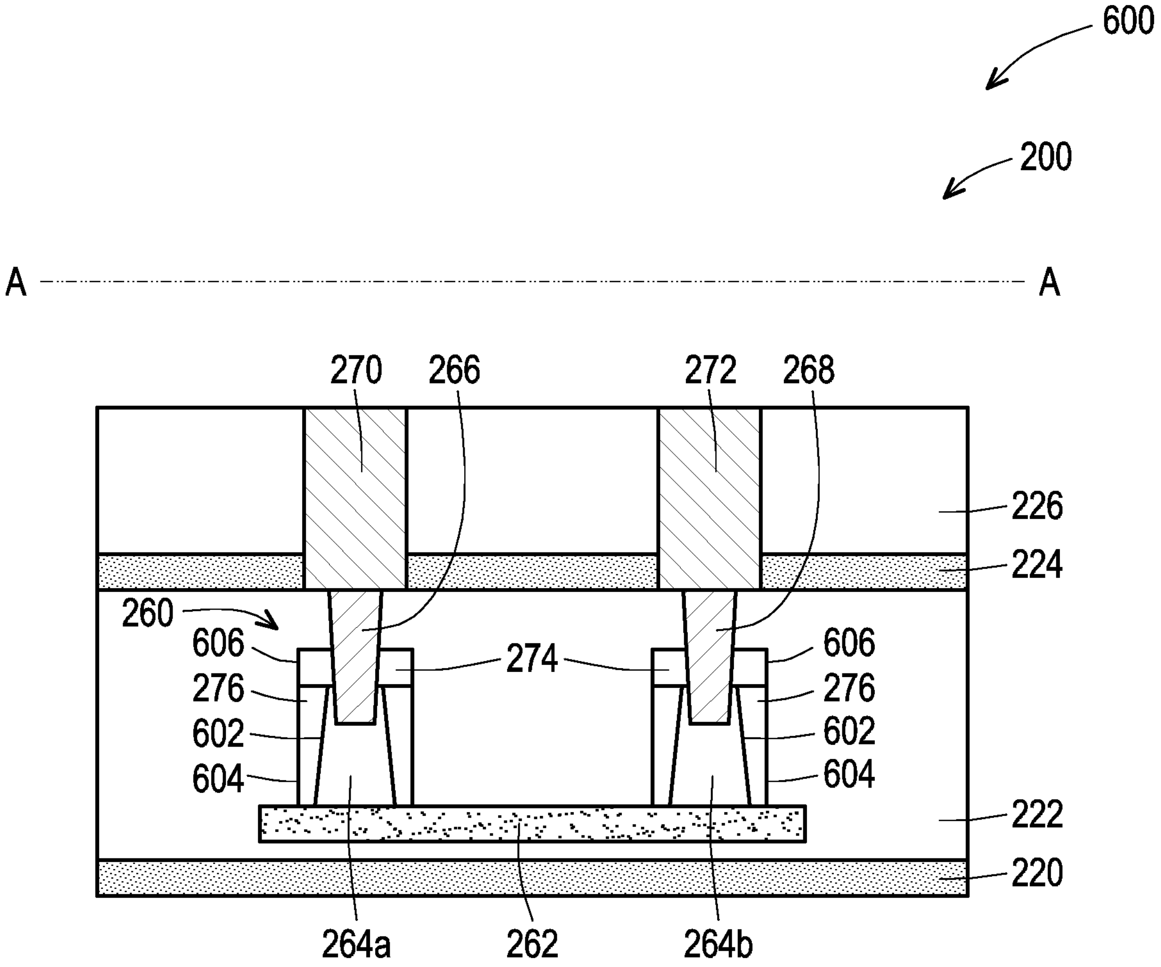
FIG. 6 is a diagram of an example implementation of the semiconductor resistor structure described herein.

FIG. 6 is a diagram of an example implementation 600 of the semiconductor resistor structure 260 described herein. FIG. 6 illustrates a cross-section view of the semiconductor resistor structure 260 in the cross-section A-A illustrated in FIG. 3. As shown in FIG. 6, the example implementation 600 may include elements 220-226 and 260-272 similar to the example implementation 400. However, in the example implementation 600, the sealing layers 276 around one or more of the contact structure 264*a* and/or 264*b* may include at least one tapered sidewall. The tapered sidewall may result from a sealing layer 276 conforming to a cross-sectional profile of the contact structure 264*a* and/or 264*b*.

The sealing layer 276 around the contact structure 264*a* may have an inner sidewall 602 and an outer sidewall 604. The inner sidewall 602 of the sealing layer 276 may interface with a sidewall of the contact structure 264*a*, and may therefore conform to a profile of the sidewall of the contact structure 264*a*. The contact structure 264*a* may have a tapered cross-sectional profile resulting in a width of the contact structure 264*a* that increases from the capping layer 274 over and/or on the contact structure 264*a* to the resistive layer 262. The inner sidewall 602 may conform to the taper of the sidewall of the contact structure 264*a*. The tapered cross-sectional profile of the contact structure 264*a* may result from a type of etchant used to form the contact structure 264*a*, a type of etch technique used to form the contact structure 264*a*, one or more processing parameters (e.g., plasma type, plasma bias, isotropic or anisotropic etch, pressure, temperature) used to form the contact structure 264*a*, and/or another factor.

The outer sidewall 604 of the sealing layer 276 may be approximately parallel with an outer sidewall 606 of a capping layer 274 over and/or on the contact structure 264*a*. Thus, the sealing layer 276 may have a tapered cross-sectional profile resulting in a width W that decreases from the capping layer 274 to the resistive layer 262 (e.g., and increases from the resistive layer 262 to the capping layer 274).

The sealing layer 276 around the contact structure 264*b* may have an inner sidewall 602 and an outer sidewall 604. The inner sidewall 602 of the sealing layer 276 may interface with a sidewall of the contact structure 264*b*, and may therefore conform to a profile of the sidewall of the contact structure 264*b*. The contact structure 264*b* may have a tapered cross-sectional profile resulting in a width of the contact structure 264*b* that increases from the capping layer 274 over and/or on the contact structure 264*b* to the resistive layer 262. The inner sidewall 602 may conform to the taper of the sidewall of the contact structure 264*b*. The tapered cross-sectional profile of the contact structure 264*b* may result from a type of etchant used to form the contact structure 264*b*, a type of etch technique used to form the contact structure 264*b*, one or more processing parameters (e.g., plasma type, plasma bias, isotropic or anisotropic etch, pressure, temperature) used to form the contact structure 264*b*, and/or another factor.

The outer sidewall 604 of the sealing layer 276 may be approximately parallel with an outer sidewall 606 of a capping layer 274 over and/or on the contact structure 264*b*. Thus, the sealing layer 276 may have a tapered profile resulting in a width W that decreases from the capping layer 274 to the resistive layer 262 (e.g., and increases from the resistive layer 262 to the capping layer 274).

As indicated above, FIG. 6 is provided as an example. Other examples may differ from what is described with regard to FIG. 6.

Figure 7:
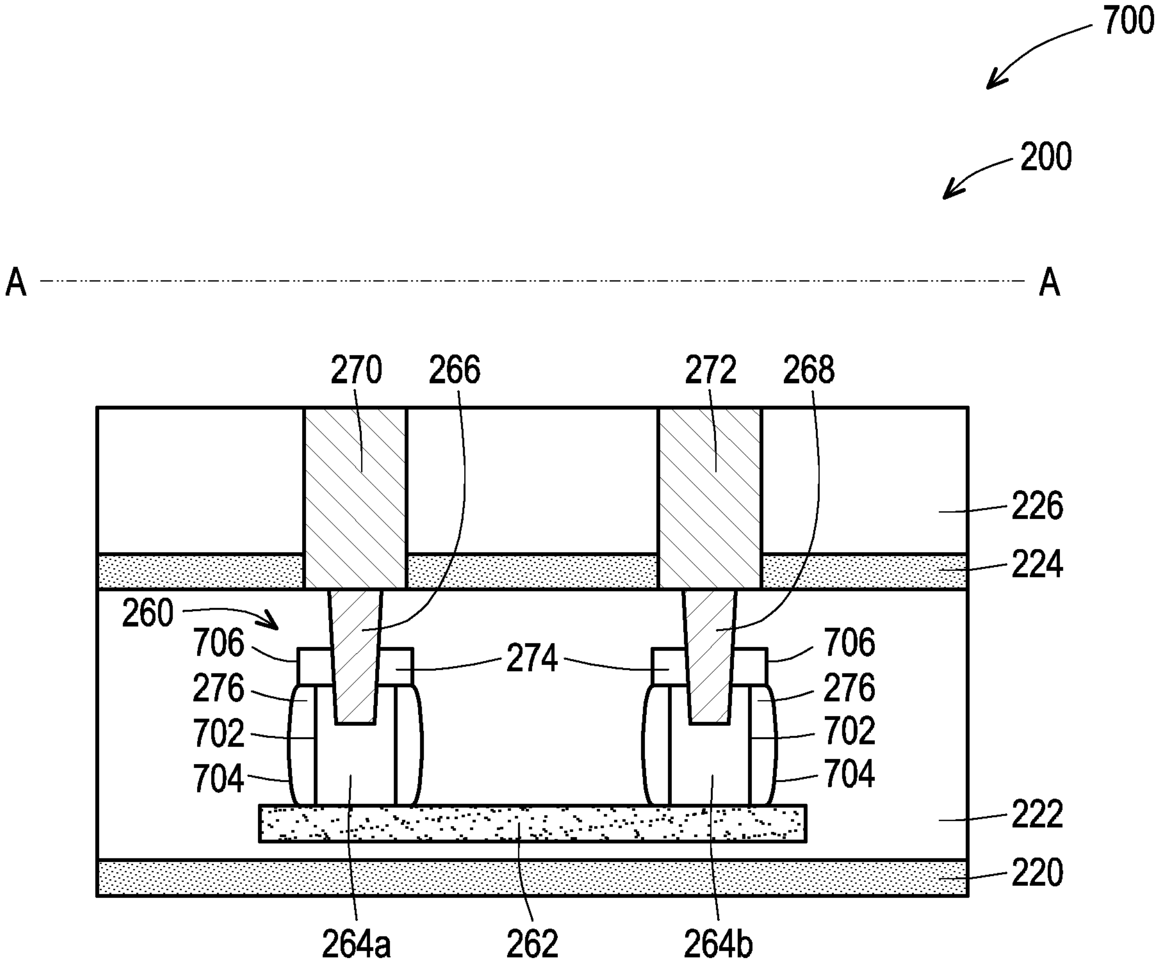
FIG. 7 is a diagram of an example implementation of the semiconductor resistor structure described herein.

FIG. 7 is a diagram of an example implementation 700 of the semiconductor resistor structure 260 described herein. FIG. 7 illustrates a cross-section view of the semiconductor resistor structure 260 in the cross-section A-A illustrated in FIG. 3. As shown in FIG. 6, the example implementation 600 may include elements 220-226 and 260-272 similar to the example implementation 400. However, in the example implementation 600, the sealing layers 276 around one or more of the contact structure 264*a* and/or 264*b* may include at least one convex sidewall. The convex sidewall may result from a deposition operation (and/or one or more parameters thereof) that is performed to form the sealing layers 276. In particular, the overhang portions around the contact structure 264*a* and/or 264*b* may be overfilled (thereby resulting in the convex sidewall(s)) to ensure that the overhang portions are fully filled in during fabrication/formation of the semiconductor resistor structure 260.

The sealing layer 276 around the contact structure 264*a* may have an inner sidewall 702 and an outer sidewall 704. The inner sidewall 502 of the sealing layer 276 may interface with a sidewall of the contact structure 264*a*, and may therefore conform to a profile of the sidewall of the contact structure 264*a*. The outer sidewall 704 of the sealing layer 276 may extend laterally outward past an outer sidewall 706 of a capping layer 274 over and/or on the contact structure 264*a*. The width W of the sealing layer 276 may increase from the resistive layer 262 toward a center of the sealing layer 276, and may increase from the capping layer 274 over and/or on the contact structure 264*a* toward the center of the sealing layer 276. Thus, the sealing layer 276 may have a convex cross-sectional profile.

The sealing layer 276 around the contact structure 264*b* may have an inner sidewall 702 and an outer sidewall 704. The inner sidewall 502 of the sealing layer 276 may interface with a sidewall of the contact structure 264*b*, and may therefore conform to a profile of the sidewall of the contact structure 264*b*. The outer sidewall 704 of the sealing layer 276 may extend laterally outward past an outer sidewall 706 of a capping layer 274 over and/or on the contact structure 264*b*. The width W of the sealing layer 276 may increase from the resistive layer 262 toward a center of the sealing layer 276, and may increase from the capping layer 274 over and/or on the contact structure 264*b* toward the center of the sealing layer 276. Thus, the sealing layer 276 may have a convex cross-sectional profile.

As indicated above, FIG. 7 is provided as an example. Other examples may differ from what is described with regard to FIG. 7.

FIGS. 8A-8L are diagrams of an example implementation 800 of forming the semiconductor resistor structure 260 described herein. In some implementations, one or more of the operations described in connection with the example implementation 800 may be performed by one or more of the semiconductor processing tools 102-112. In some implementations, one or more of the operations described in connection with the example implementation 800 may be performed another semiconductor processing tool. In some implementations, one or more of the operations described in connection with the example implementation 800 may be performed after formation of one or more other structures or layers of the semiconductor device 200.

Figure 8A:
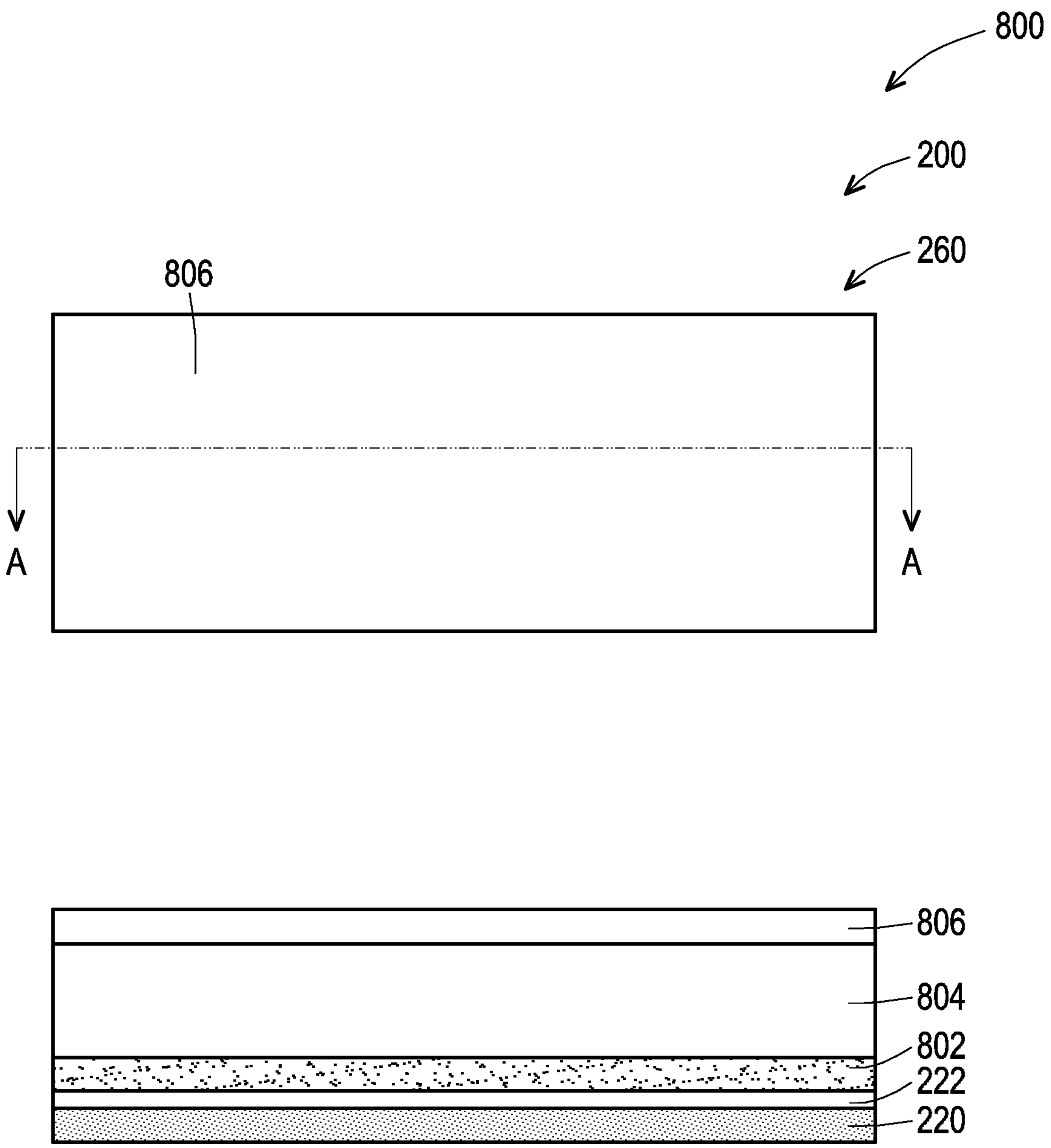
FIGS. 8A-8L are diagrams of an example implementation of forming the semiconductor resistor structure described herein.

Turning to FIG. 8A, the operations described in connection with the example implementation 800 may be performed in a BEOL region of the semiconductor device 200. For example, a portion of the dielectric layer 222 may be formed over and/or on the ESL 220, a dielectric layer 802 may be formed over and/or on the portion of the dielectric layer 222, a conductive layer 804 may be formed over and/or on the dielectric layer 802, and/or a hard mask layer 806 may be formed over and/or on the conductive layer 804, among other examples.

The deposition tool 102 may deposit the ESL 220, the portion of the dielectric layer 222, the dielectric layer 802, and/or the hard mask layer 806 using an epitaxy technique, a CVD technique, a PVD technique, an ALD technique, another deposition technique described above in connection with FIG. 1, and/or a deposition technique other than as described above in connection with FIG. 1. The deposition tool 102 and/or the plating tool 112 may deposit the conductive layer 804 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the ESL 220, the portion of the dielectric layer 206, the dielectric layer 802, the conductive layer 804, and/or the hard mask layer 806.

Figure 8B:
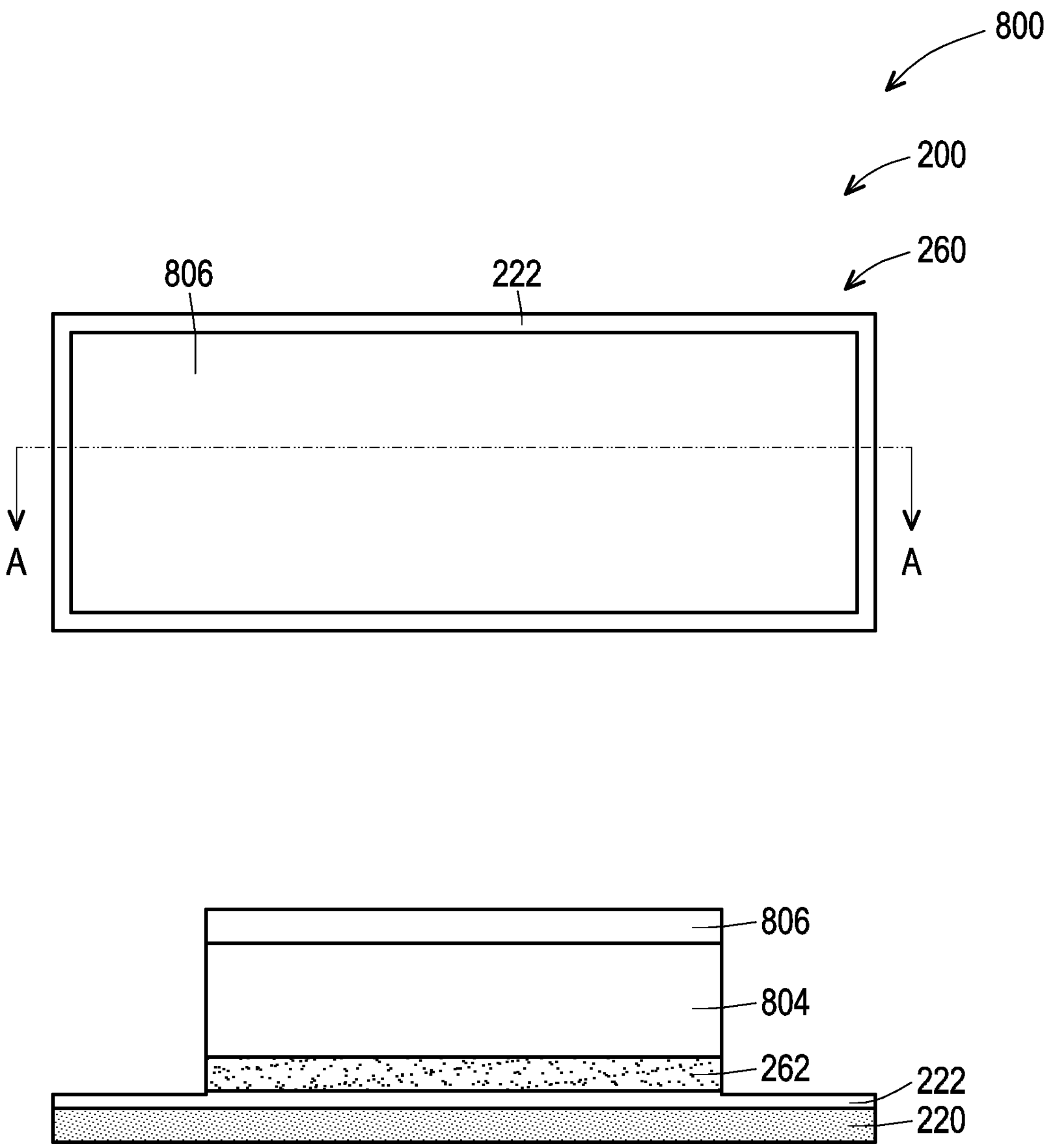

As shown in FIG. 8B, portions of the dielectric layer 802 may be removed to form the resistive layer 262. In some implementations, a pattern in a photoresist layer is used to remove portions of the dielectric layer 802 to form the resistive layer 262. In these implementations, the deposition tool 102 forms the photoresist layer over the hard mask layer 806. The exposure tool 104 exposes the photoresist layer to a radiation source to pattern the photoresist layer. The developer tool 106 develops and removes portions of the photoresist layer to expose the pattern. The etch tool 108 etches through the hard mask layer 806, through the conductive layer 804, and through the dielectric layer 802 to form the resistive layer 262. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

In some implementations, the etch tool 108 etches into a portion of the underlying dielectric layer 222 to ensure that the dielectric layer 802 is fully etched through. This is referred over etching. The combination of the thickness of the resistive layer 262 and the depth of the over etching into the dielectric layer 222 may be included in a range of approximately 400 angstroms to approximately 600 angstroms. However, other values for the range are within the scope of the present disclosure.

Figure 8C:
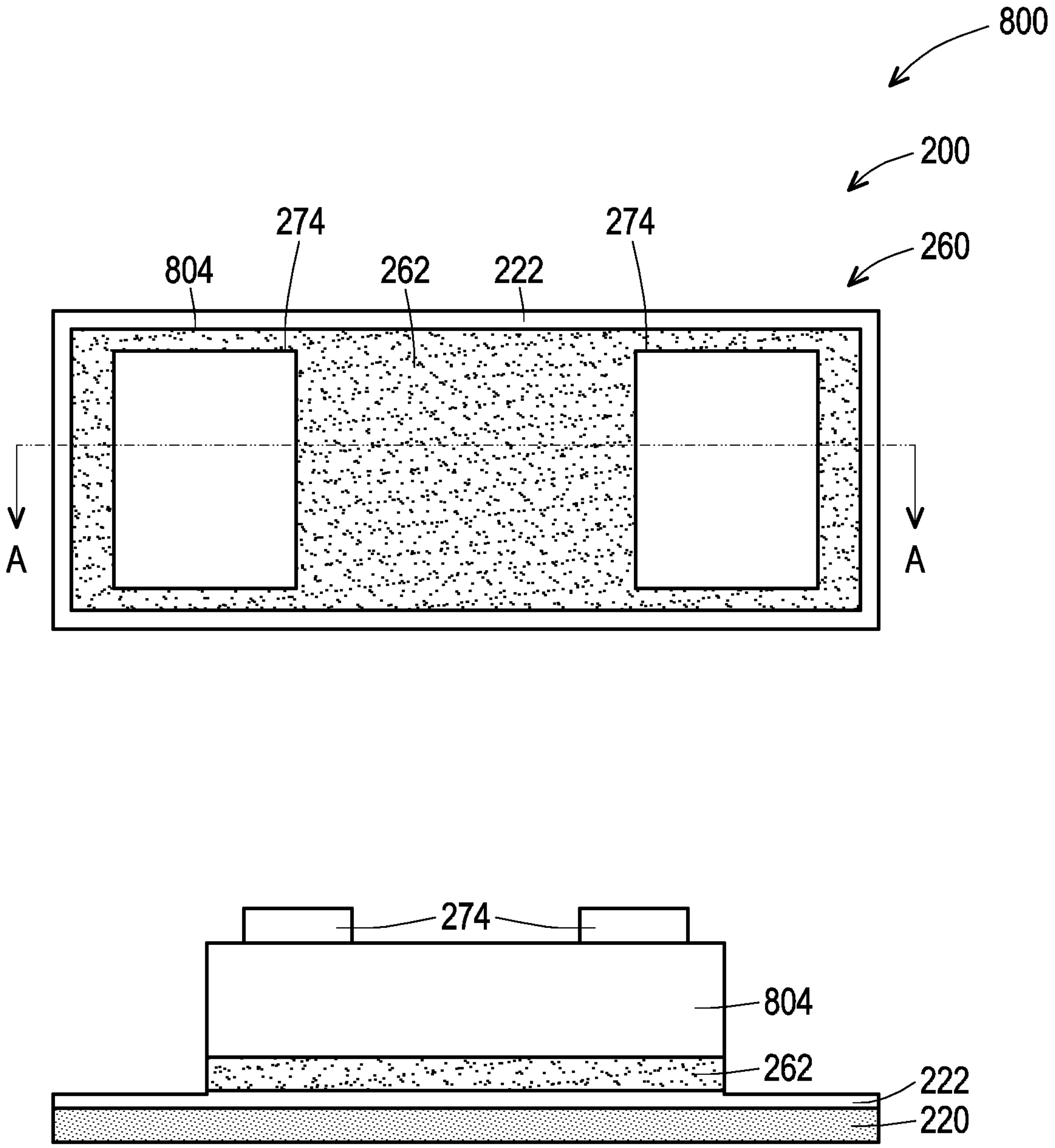

As shown in FIG. 8C, portions of the hard mask layer 806 may be removed. Remaining portions of the hard mask layer 806 correspond to the capping layers 274 of the semiconductor resistor structure 260. In some implementations, a pattern in a photoresist layer is used to remove portions of the hard mask layer 806 to form the capping layers 274. In these implementations, the deposition tool 102 forms the photoresist layer over the hard mask layer 806. The exposure tool 104 exposes the photoresist layer to a radiation source to pattern the photoresist layer. The developer tool 106 develops and removes portions of the photoresist layer to expose the pattern. The etch tool 108 etches through the hard mask layer 806 to form the capping layers 274. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 8D:
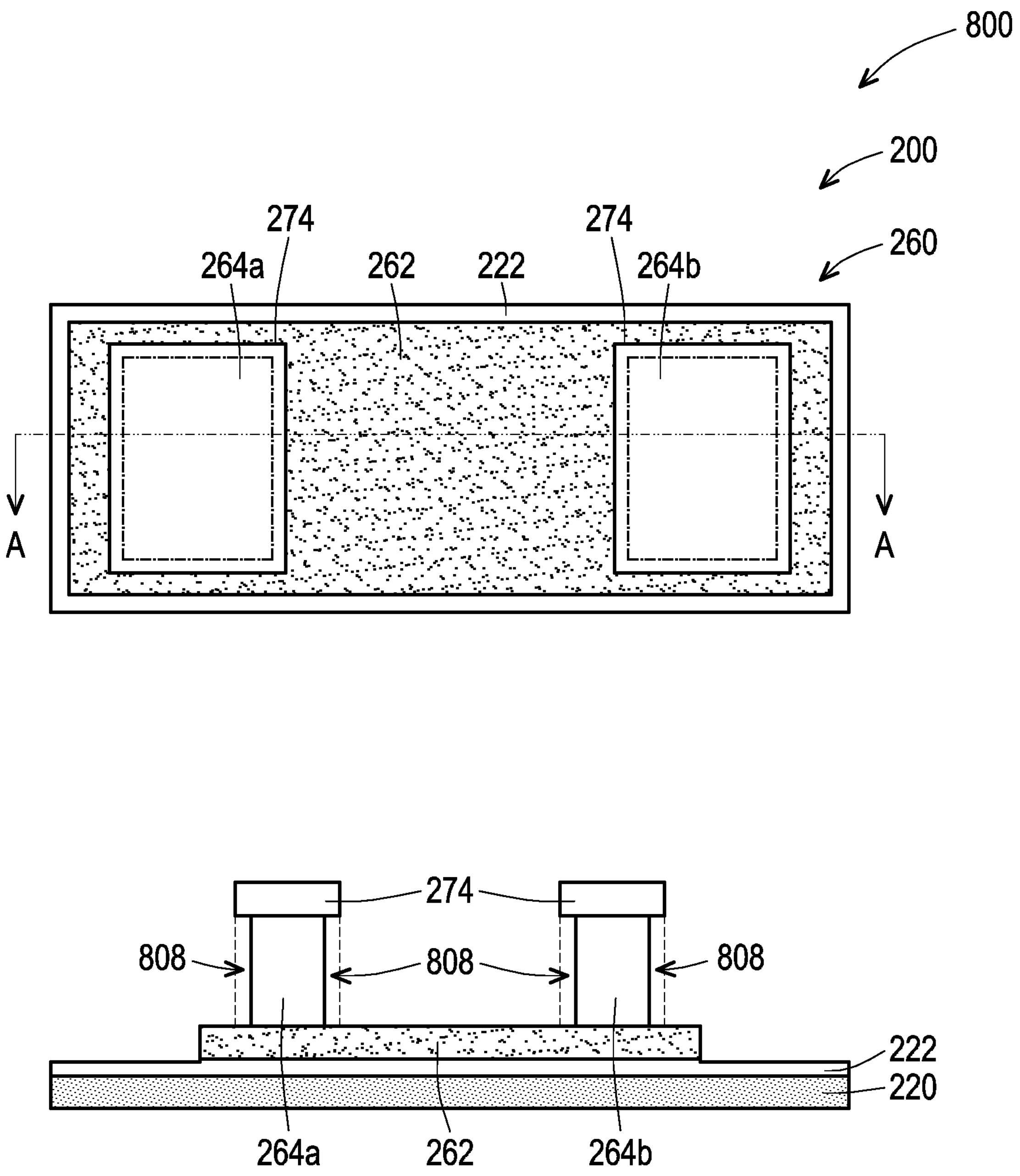

As shown in FIG. 8D, portions of the conductive layer 804 are removed. Remaining portions of the conductive layer correspond to the contact structures 264*a* and 264*b*. The etch tool 108 may etch the conductive layer 804 to remove the portions of the conductive layer 804. The etch tool 108 may etch the conductive layer 804 based on a pattern in the hard mask layer 806 that was formed in the operation to remove the portions of the hard mask layer 806 to form the capping layers 274. In other words, the capping layers 274 function as an etch pattern to etch the conductive layer 804 to form the contact structures 264*a* and 264*b*. In some implementations, the etch operation includes a plasma etch technique, a wet chemical etch technique, and/or another type of etch technique.

As further shown in FIG. 8D, the contact structures 264*a* and 264*b* may be laterally etched in the etch operation to form the contact structures 264*a* and 264*b*. The lateral etching of the contact structures 264*a* and 264*b* may occur due to the duration of the etch operation and the time under exposure of the etchant used in the etch operation. In particular, the etch operation may be performed for a duration that is sufficient to expose the top surface of the resistive layer 262. This may result in increased exposure of the sidewalls of the contact structures 264*a* and 264*b* to the etchant, which may result in the lateral etching of the contact structures 264*a* and 264*b*.

Overhang regions 808 along sidewalls of the contact structures 264*a* and 264*b* form as a result of the lateral etching of the contact structures 264*a* and 264*b*. This occurs due to the etch selectivity between the contact structures 264*a* and 264*b* and the capping layers 274. In particular, the etch rate of the capping layers 274 may be lesser relative to the etch rate of the contact structures 264*a* and 264*b*, thereby resulting in overhang portions of the capping layers 274 extending laterally outward from the contact structures 264*a* and 264*b*. The areas under the overhang portions of the capping layers corresponds to the overhang region 808.

Figure 8E:
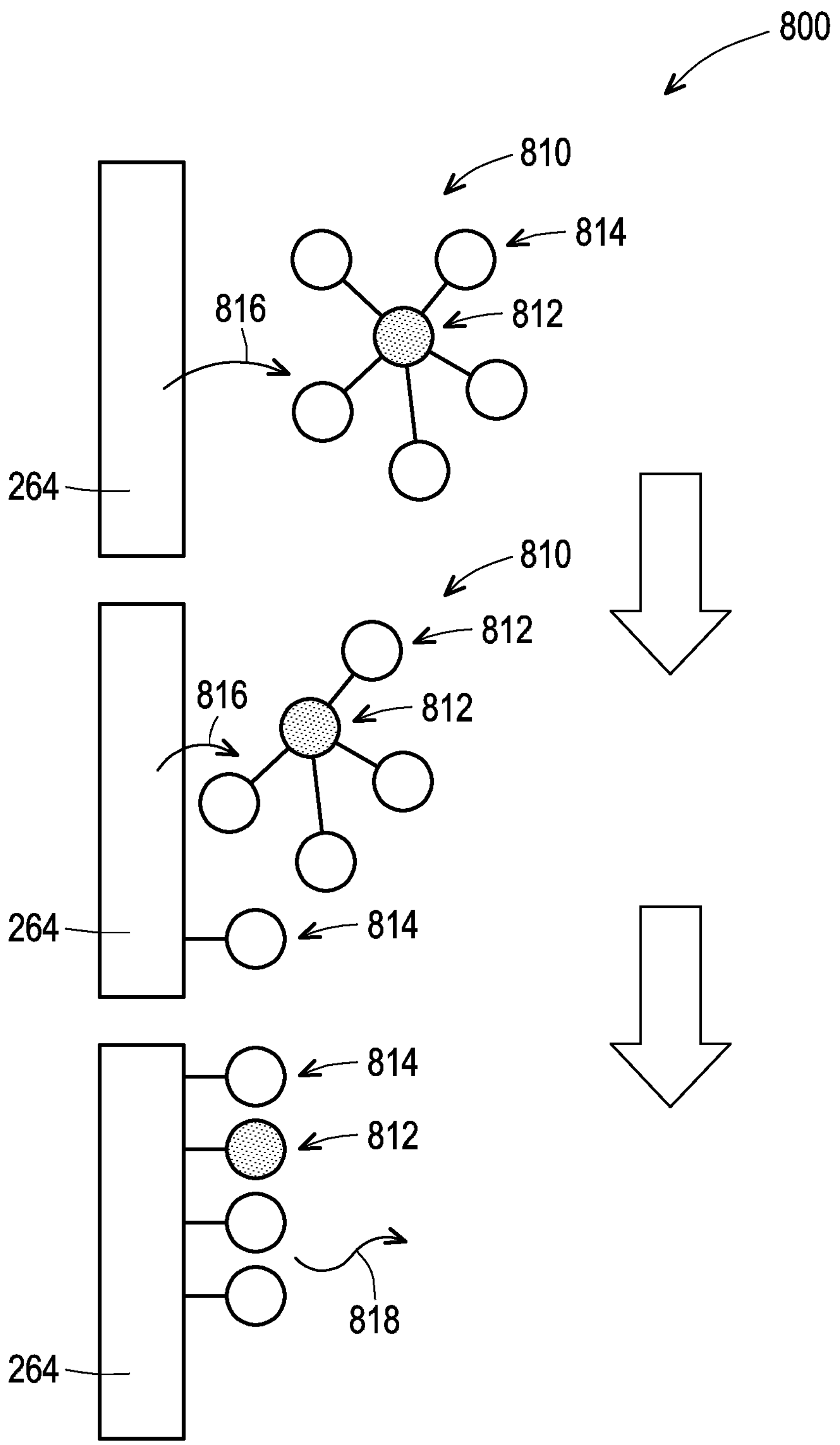
Figure 8F:
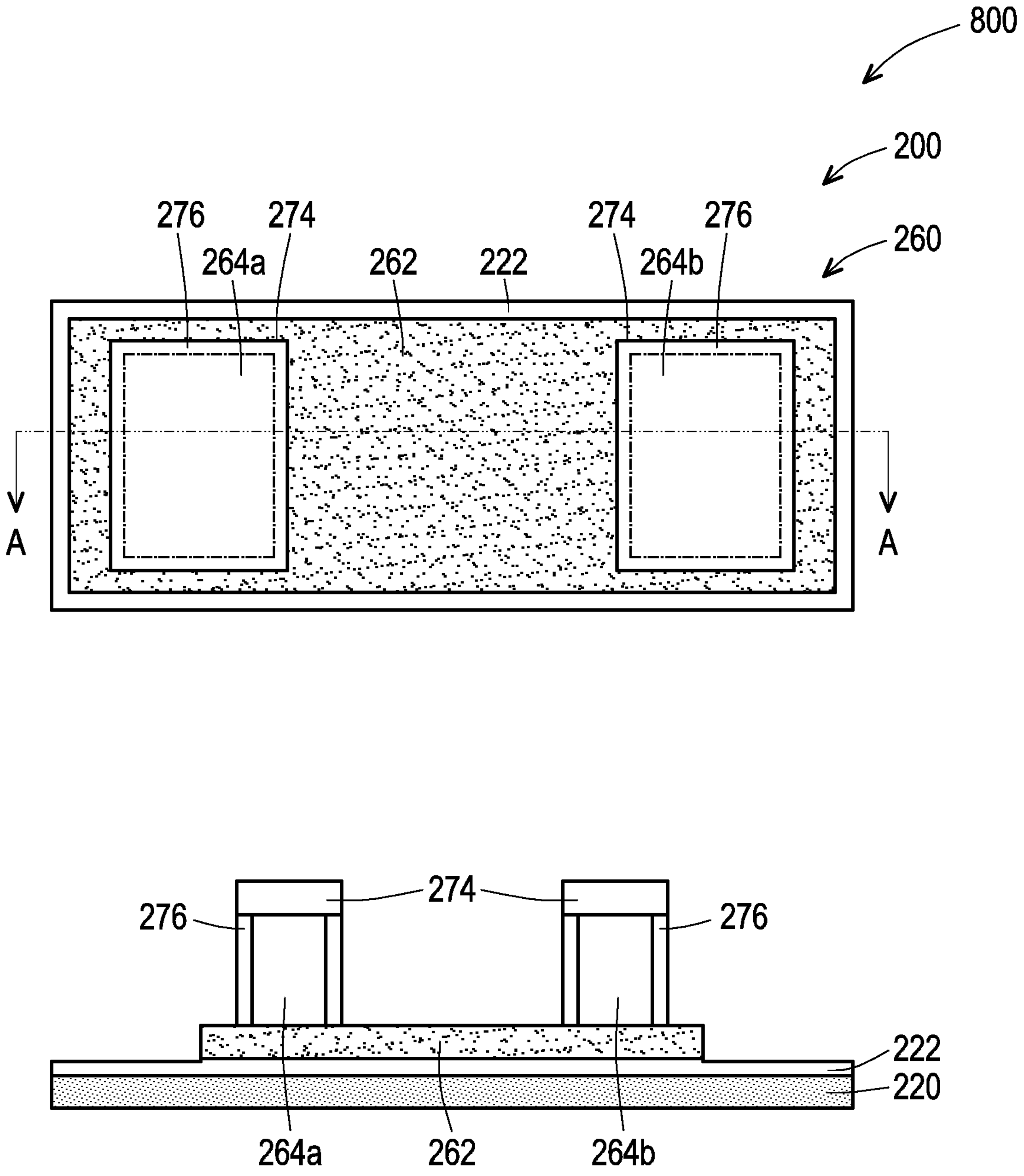

As shown in FIGS. 8E and 8F, sealing layers 276 may be formed around the contact structures 264*a* and 264*b* (shown generically as contact structure 264) to fill in the overhang regions 808 so as to reduce or substantially eliminate the likelihood of void formation in the overhang regions 808 when additional material of the dielectric layer 222 is formed around and over the semiconductor resistor structure 260. The deposition tool 102 may use a selective deposition technique such that material of the sealing layers 276 is deposited onto the sidewalls of the contact structures 264*a* and 264*b* and not on the other layers and/or structures of the semiconductor resistor structure 260.

The deposition tool 102 may deposit the sealing layers 276 in a plurality of thermal ALD cycles, where a portion of the sealing layers 276 is deposited in each of the plurality of thermal ALD cycles. Each thermal ALD cycle may expose the surface of the sidewalls of the contact structures 264*a* and 264*b* to a sequence of precursor. For example, a thermal ALD cycle may include a first operation in which a first precursor is deposited onto the sidewalls of the contact structures 264*a* and 264*b*, and a reaction occurs between the first precursor and the sidewalls of the contact structures 264*a* and 264*b*. Then the first precursor is evacuated from a processing chamber in which the semiconductor device 200 is included. Subsequently, a second precursor is deposited onto the sidewalls of the contact structures 264*a* and 264*b*, and a reaction occurs between the second precursor and the sidewalls of the contact structures 264*a* and 264*b*. Then the second precursor is evacuated from a processing chamber in which the semiconductor device 200 is included.

In some implementations, the quantity of thermal ALD cycles that is performed to deposit the sealing layers 276 is included in a range of approximately 1000 thermal ALD cycles to approximately 3000 thermal ALD cycles. However, other values for the range are within the scope of the present disclosure. In some implementations, another deposition technique, such as CVD or PVD, is used to deposit the sealing layers 276. In some implementations, a thermal ALD cycle may be performed at a temperature that is included in a range of approximately 350 degrees Celsius to approximately 450 degrees Celsius. However, other values for the range are within the scope of the present disclosure. In some implementations, a thermal ALD cycle may be performed at a pressure that is included in a range of approximately 3 torr to approximately 10 torr. However, other values for the range are within the scope of the present disclosure.

To achieve the selective deposition of the sealing layers 276, a material is selected for the sealing layers 276 that promotes bonding and growth on the sidewalls of the contact structures 264*a* and 264*b*, and that resists bonding and growth other layers and/or structures of the semiconductor resistor structure 260. In some implementations, a metallic material is used for depositing the sealing layers 276 on the sidewalls of the contact structures 264*a* and 264*b* because of the electron exchange that facilitates bonding of the metallic material to the sidewalls of the contact structures 264*a* and 264*b*. The conductive material of the contact structures 264*a* and 264*b* may promote electron exchange between the contact structures 264*a* and 264*b* and a metallic material, such as tungsten (W) and/or molybdenum (Mo), among other examples, due to the high electron mobility of the conductive material of the contact structures 264*a* and 264*b* relative to the dielectric material of the other structures and layers of the semiconductor resistor structure 260.

FIG. 8E illustrates an example of the electron exchange between the conductive material of the contact structures 264*a* and 264*b* and the metallic material used for the sealing layers 276. In particular, FIG. 8E illustrates an example of electron exchange in a fluorine-free tungsten (FFW) deposition operation. As shown in FIG. 8E, a precursor 810 may be provided to a surface of a contact structure 264 (e.g., the contact structure 264*a*, the contact structure 264*b*). The precursor 810 may include a tungsten (W) precursor such as tungsten chloride ($WCl_x$ such as $WCl_5$ illustrated in the example in FIG. 8E) or tungsten fluoride ($WF_x$ such as $WF_6$), a molybdenum precursor such as molybdenum chloride ($MoCl_x$ such as $MoCl_6$), and/or another suitable metallic precursor. The precursor 810 may include a metallic material 812 (e.g., tungsten (W)) bonded with a reactant material 814 (e.g., chlorine (Cl)). A reactant such as a hydrogen gas ($H_2$) may be used to facilitate the exchange of electrons 816 from the surface of the contact structure 264 to the reactant material 814 of the precursor 810. As the electron exchange continues, the bonds between the reactant material 814 and the metallic material 812 are broken, which results in the metallic material 812 bonding with the contact structure 264, and the reactant material 814 being removed as a byproduct 818. An example of the reaction described above includes:

$$WCl_x + H_2 \rightarrow W\text{-}H + HCl$$

$$W\text{-}H + WCL_5 \rightarrow WCl_x + HCl$$

Figure 8G:
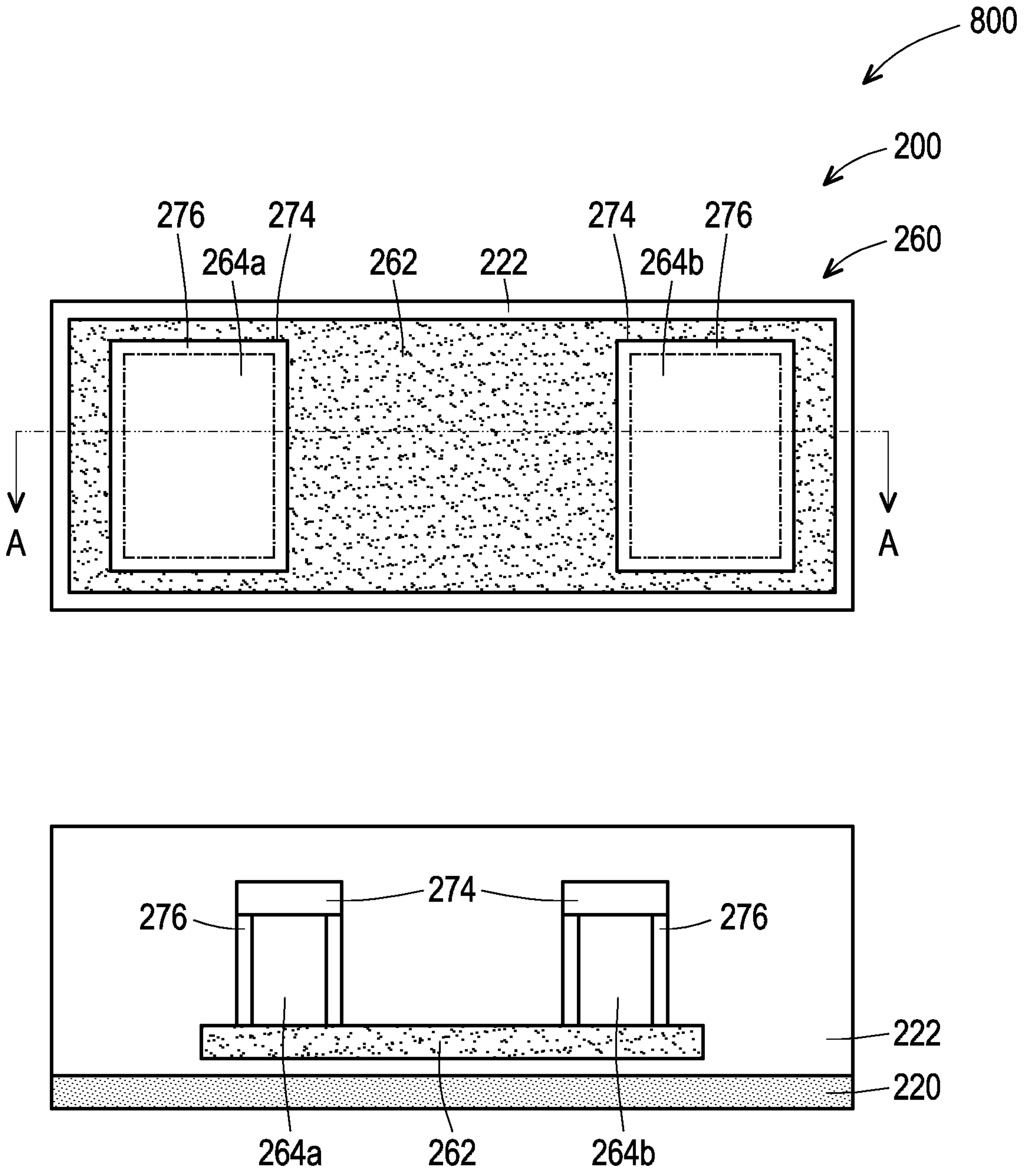

As shown in FIG. 8G, an additional portion of the dielectric layer 222 may be formed over, on, and/or around the semiconductor resistor structure 260. The deposition tool 102 may deposit the additional portion of the dielectric layer 222 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 222 after the additional portion of the dielectric layer 222 is deposited.

Figure 8H:
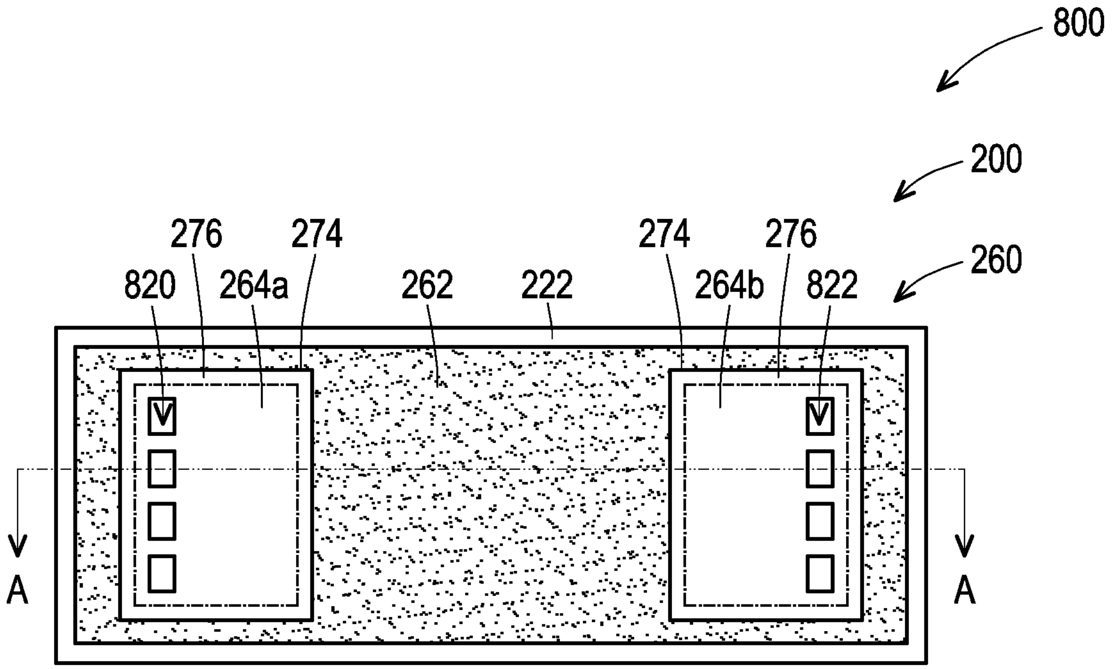
Figure 8H:
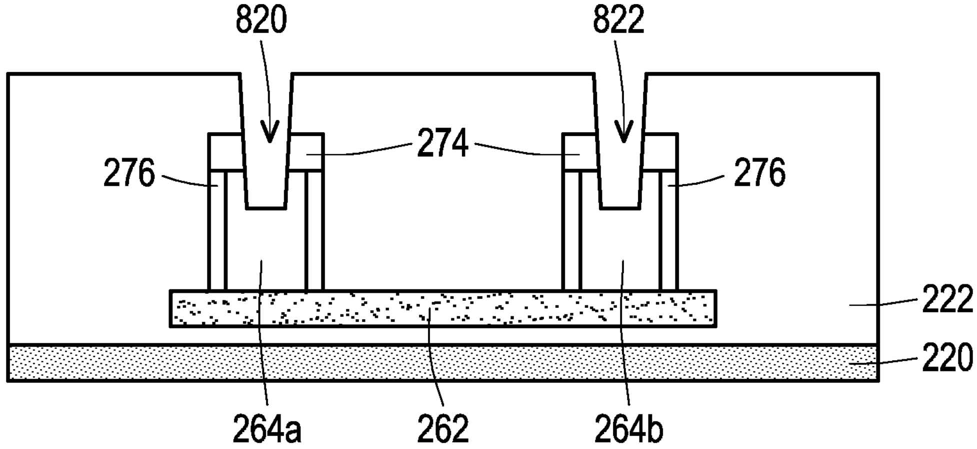

As shown in FIG. 8H, recesses 820 and 822 may be respectively formed in the dielectric layer 222, through the capping layers 274, and into a portion of the contact structures 264*a* and 264*b*. In these implementations, the deposition tool 102 forms the photoresist layer over the dielectric layer 222. The exposure tool 104 exposes the photoresist layer to a radiation source to pattern the photoresist layer. The developer tool 106 develops and removes portions of the photoresist layer to expose the pattern. The etch tool 108 etches through the dielectric layer 222, through the capping layers 274, and into a portion of the contact structures 264*a* and 264*b* to respectively form the recesses 820 and 822. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 8I:
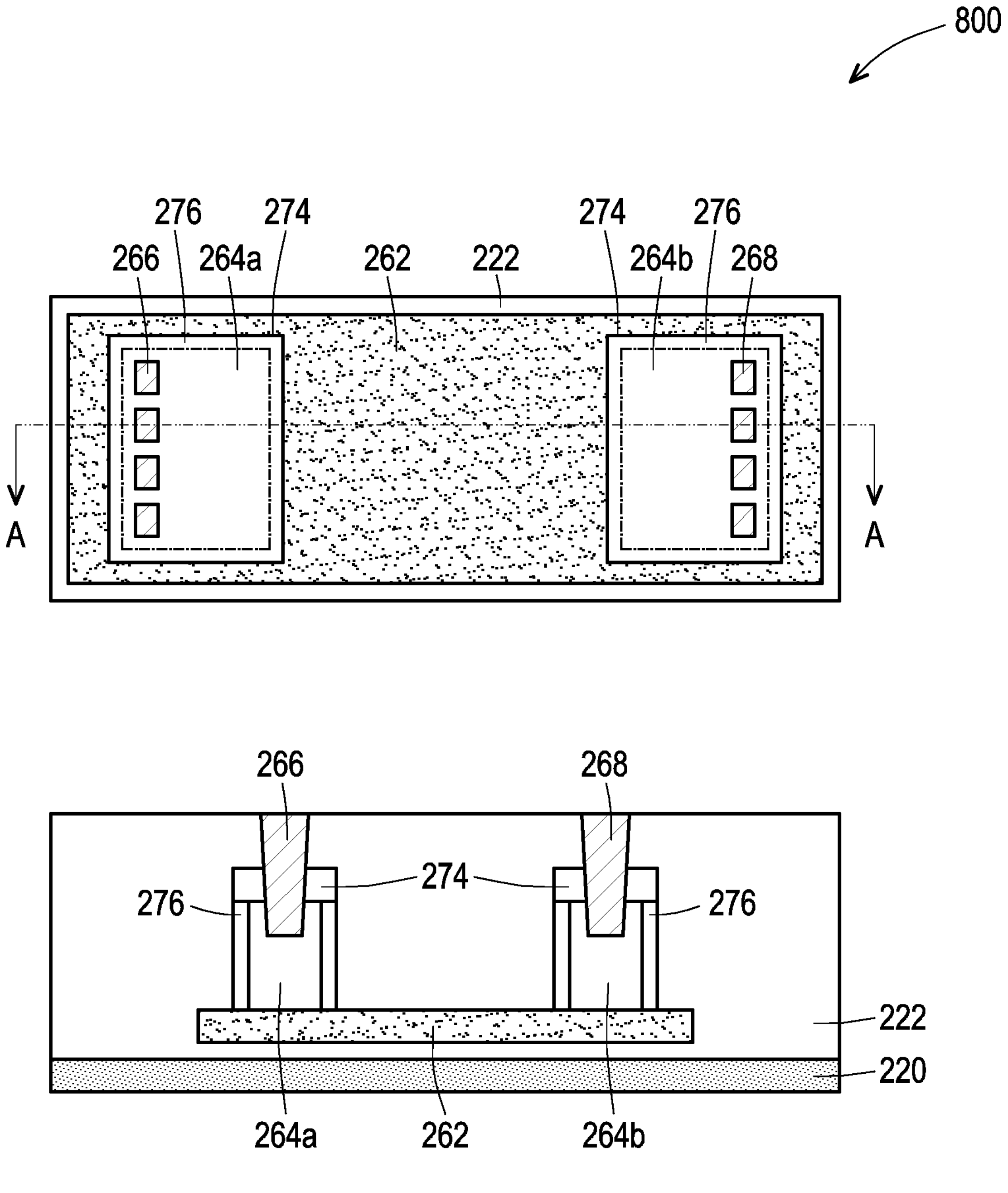

As shown in FIG. 8I, the recesses 820 and 822 may be filled with one or more conductive materials to respectively form the vias 266 and 268 in the recesses 820 and 822. The deposition tool 102 and/or the plating tool 112 may deposit the vias 266 and 268 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the vias 266 and/or the vias 268.

Figure 8J:
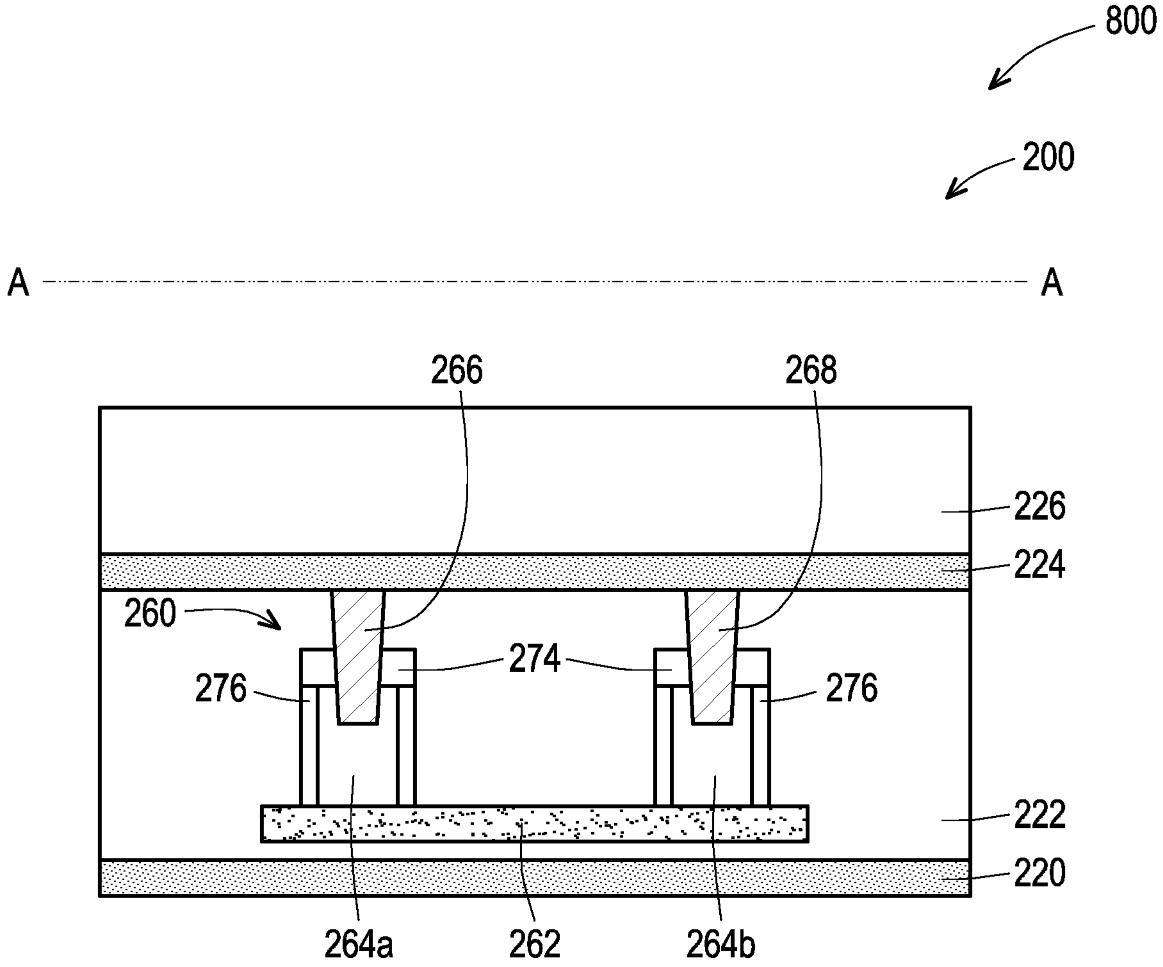

As shown in FIG. 8J, additional dielectric layers of the BEOL region may be formed over the semiconductor resistor structure 260. For example, the ESL 224 may be formed over the semiconductor resistor structure 260 and over and/or on the dielectric layer 222. As another example, the dielectric layer 226 may be formed over and/or on the ESL 224. The deposition tool 102 may deposit the ESL 224 and/or the dielectric layer 226 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the ESL 224 and/or the dielectric layer 226 after the ESL 224 and/or the dielectric layer 226 is deposited.

Figure 8K:
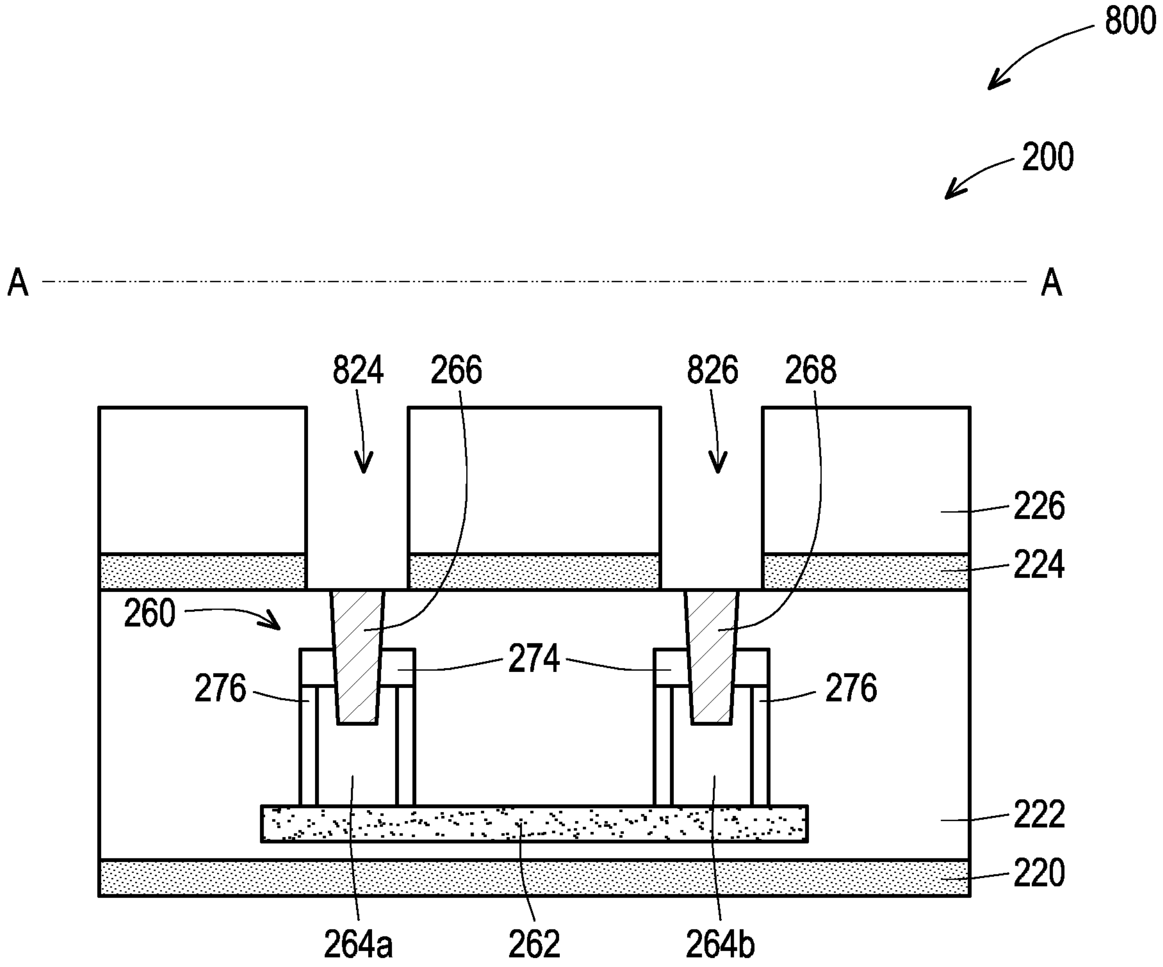

As shown in FIG. 8K, recesses 824 and 826 may be respectively formed through the dielectric layer 226 and through the ESL 224 to expose top surfaces of the vias 266 and 268, respectively. In these implementations, the deposition tool 102 forms the photoresist layer over the dielectric layer 226. The exposure tool 104 exposes the photoresist layer to a radiation source to pattern the photoresist layer. The developer tool 106 develops and removes portions of the photoresist layer to expose the pattern. The etch tool 108 etches through the dielectric layer 226 and through the ESL 224 to form the recesses 820 and 822. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 8L:
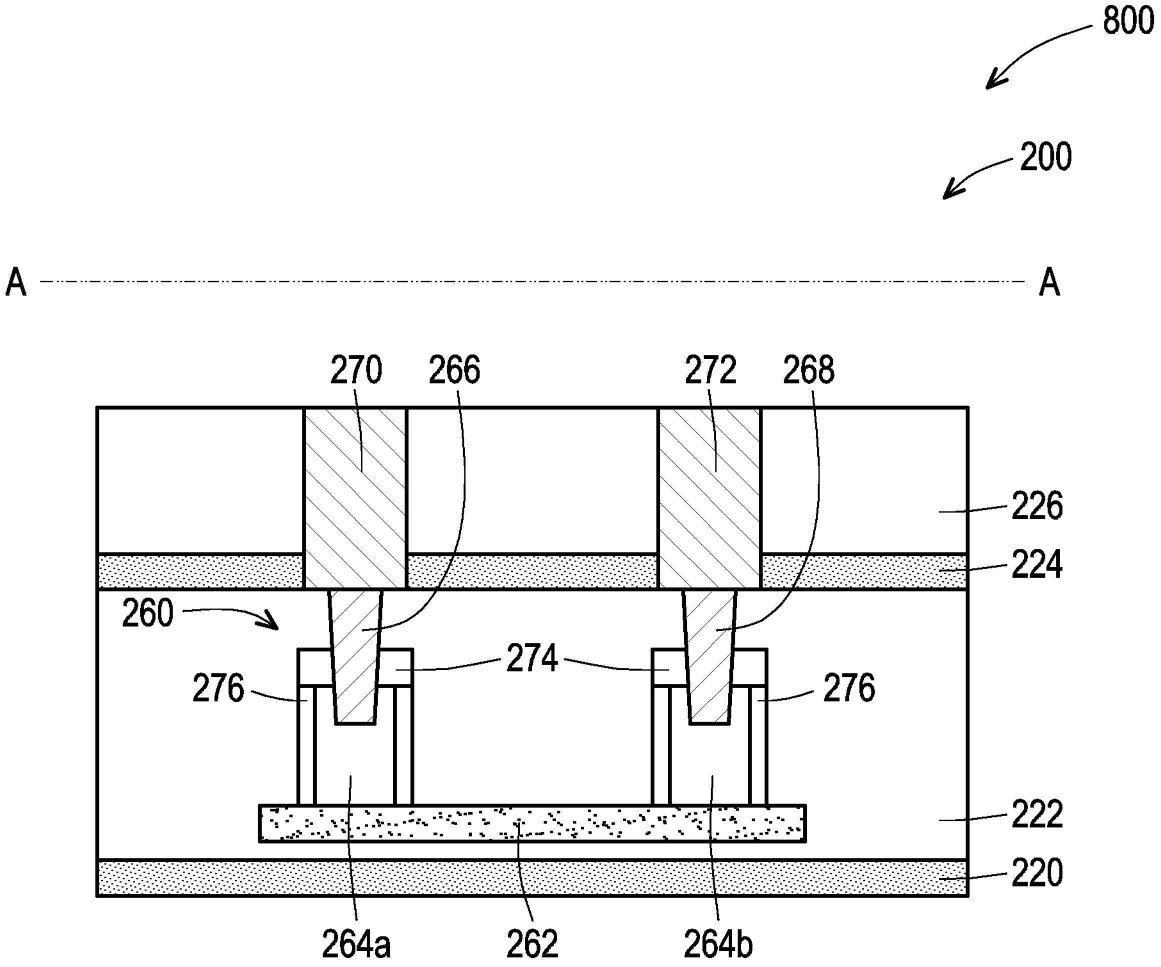

As shown in FIG. 8L, the recesses 824 and 826 may be filled with one or more conductive materials to respectively form the conductive structures 270 and 272 in the recesses 824 and 826. The deposition tool 102 and/or the plating tool 112 may deposit the conductive structures 270 and 272 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the conductive structures 270 and/or 272.

As indicated above, FIGS. 8A-8L are provided as an example. Other examples may differ from what is described with regard to FIGS. 8A-8L.

Figure 9:
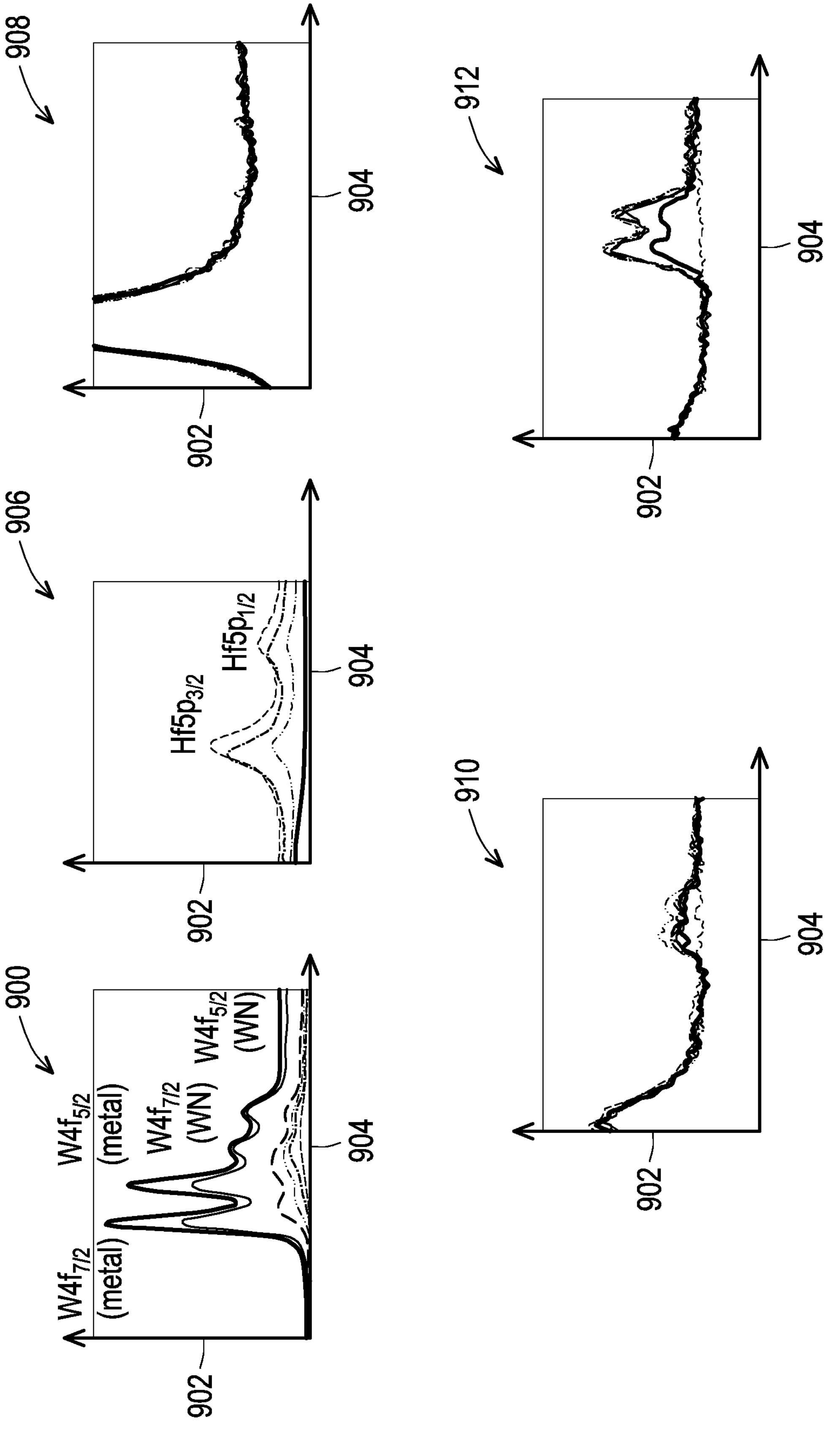
FIG. 9 is a diagram of examples of forming a sealing layer on different substrates described herein.

FIG. 9 is a diagram of examples of forming a sealing layer 276 on different substrates described herein.

An example 900 in FIG. 9 illustrates a photoelectron count 902 as a function of binding energy 904 for bonding tungsten (W) material of a sealing layer 276 to a titanium nitride (TiN) surface of a contact structure (e.g., the contact structure 264*a*, the contact structure 264*b*) of the semiconductor resistor structure 260 described herein. An example 906 in FIG. 9 illustrates a photoelectron count 902 as a function of binding energy 904 for bonding tungsten (W) material of a sealing layer 276 to a hafnium oxide ($HfO_x$) surface of a capping layer 274 of the semiconductor resistor structure 260 described herein. An example 908 in FIG. 9 illustrates a photoelectron count 902 as a function of binding energy 904 for bonding tungsten (W) material of a sealing layer 276 to an oxide (e.g., a silicon oxide ($SiO_x$)) surface of a dielectric layer 222 of the semiconductor resistor structure 260 described herein. An example 910 in FIG. 9 illustrates a photoelectron count 902 as a function of binding energy 904 for bonding tungsten (W) material of a sealing layer 276 to a silicon oxynitride (SiON or KN1) surface of a capping layer 274 of the semiconductor resistor structure 260 described herein. An example 912 in FIG. 9 illustrates a photoelectron count 902 as a function of binding energy 904 for bonding tungsten (W) material of a sealing layer 276 to a nitride (e.g., a silicon nitride ($Si_xN_y$) surface of a capping layer 274 of the semiconductor resistor structure 260 described herein.

Generally, tungsten (W) bonds with and grows at a faster rate on the titanium nitride (TiN) surface of a contact structure of the semiconductor resistor structure 260 relative to the dielectric surfaces of the dielectric layer 222, resistive layer 262, and the capping layer 274 of the semiconductor resistor structure 260. Therefore, the photoelectron count 902 for a same binding energy 904 is greater for tungsten (W) on the titanium nitride (TiN) surface of a contact structure relative to on dielectric surfaces of the dielectric layer 222, resistive layer 262, and the capping layer 274 of the semiconductor resistor structure 260. In other words, tungsten (W) more readily grows on the titanium nitride (TiN) surface of a contact structure relative to on dielectric surfaces of the dielectric layer 222, resistive layer 262, and the capping layer 274 of the semiconductor resistor structure 260 due to the greater electron mobility of the titanium nitride (TiN) surface relative to the electron mobility of the dielectric surfaces of the dielectric layer 222, resistive layer 262, and the capping layer 274 of the semiconductor resistor structure 260.

As indicated above, FIG. 9 is provided as an example. Other examples may differ from what is described with regard to FIG. 9.

Figure 10:
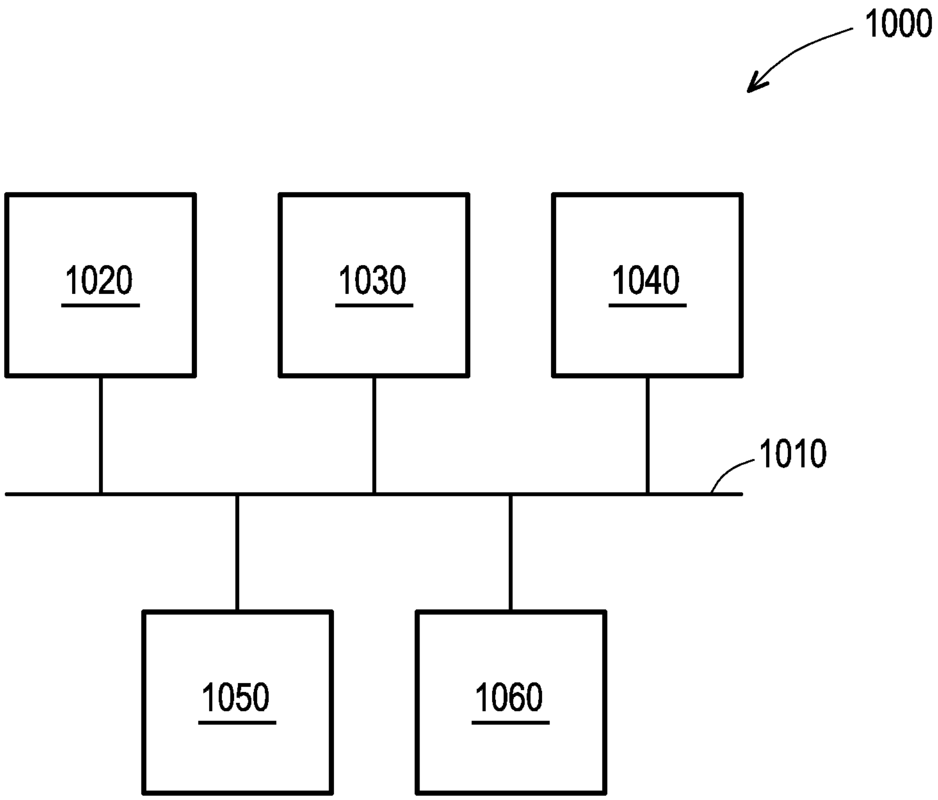
FIG. 10 is a diagram of example components of a device described herein.

FIG. 10 is a diagram of example components of a device 1000 described herein. In some implementations, one or more of the semiconductor processing tools 102-112 and/or the wafer/die transport tool 114 may include one or more devices 1000 and/or one or more components of the device 1000. As shown in FIG. 10, the device 1000 may include a bus 1010, a processor 1020, a memory 1030, an input component 1040, an output component 1050, and/or a communication component 1060.

The bus 1010 may include one or more components that enable wired and/or wireless communication among the components of the device 1000. The bus 1010 may couple together two or more components of FIG. 10, such as via operative coupling, communicative coupling, electronic coupling, and/or electric coupling. For example, the bus 1010 may include an electrical connection (e.g., a wire, a trace, and/or a lead) and/or a wireless bus. The processor 1020 may include a central processing unit, a graphics processing unit, a microprocessor, a controller, a microcontroller, a digital signal processor, a field-programmable gate array, an application-specific integrated circuit, and/or another type of processing component. The processor 1020 may be implemented in hardware, firmware, or a combination of hardware and software. In some implementations, the processor 1020 may include one or more processors capable of being programmed to perform one or more operations or processes described elsewhere herein.

The memory 1030 may include volatile and/or nonvolatile memory. For example, the memory 1030 may include random access memory (RAM), read only memory (ROM), a hard disk drive, and/or another type of memory (e.g., a flash memory, a magnetic memory, and/or an optical memory). The memory 1030 may include internal memory (e.g., RAM, ROM, or a hard disk drive) and/or removable memory (e.g., removable via a universal serial bus connection). The memory 1030 may be a non-transitory computer-readable medium. The memory 1030 may store information, one or more instructions, and/or software (e.g., one or more software applications) related to the operation of the device 1000. In some implementations, the memory 1030 may include one or more memories that are coupled (e.g., communicatively coupled) to one or more processors (e.g., processor 1020), such as via the bus 1010. Communicative coupling between a processor 1020 and a memory 1030 may enable the processor 1020 to read and/or process information stored in the memory 1030 and/or to store information in the memory 1030.

The input component 1040 may enable the device 1000 to receive input, such as user input and/or sensed input. For example, the input component 1040 may include a touch screen, a keyboard, a keypad, a mouse, a button, a microphone, a switch, a sensor, a global positioning system sensor, an accelerometer, a gyroscope, and/or an actuator. The output component 1050 may enable the device 1000 to provide output, such as via a display, a speaker, and/or a light-emitting diode. The communication component 1060 may enable the device 1000 to communicate with other devices via a wired connection and/or a wireless connection. For example, the communication component 1060 may include a receiver, a transmitter, a transceiver, a modem, a network interface card, and/or an antenna.

The device 1000 may perform one or more operations or processes described herein. For example, a non-transitory computer-readable medium (e.g., memory 1030) may store a set of instructions (e.g., one or more instructions or code) for execution by the processor 1020. The processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry may be used instead of or in combination with the instructions to perform one or more operations or processes described herein. Additionally, or alternatively, the processor 1020 may be configured to perform one or more operations or processes described herein. Thus, implementations described herein are not limited to any specific combination of hardware circuitry and software.

The number and arrangement of components shown in FIG. 10 are provided as an example. The device 1000 may include additional components, fewer components, different components, or differently arranged components than those shown in FIG. 10. Additionally, or alternatively, a set of components (e.g., one or more components) of the device 1000 may perform one or more functions described as being performed by another set of components of the device 1000.

Figure 11:
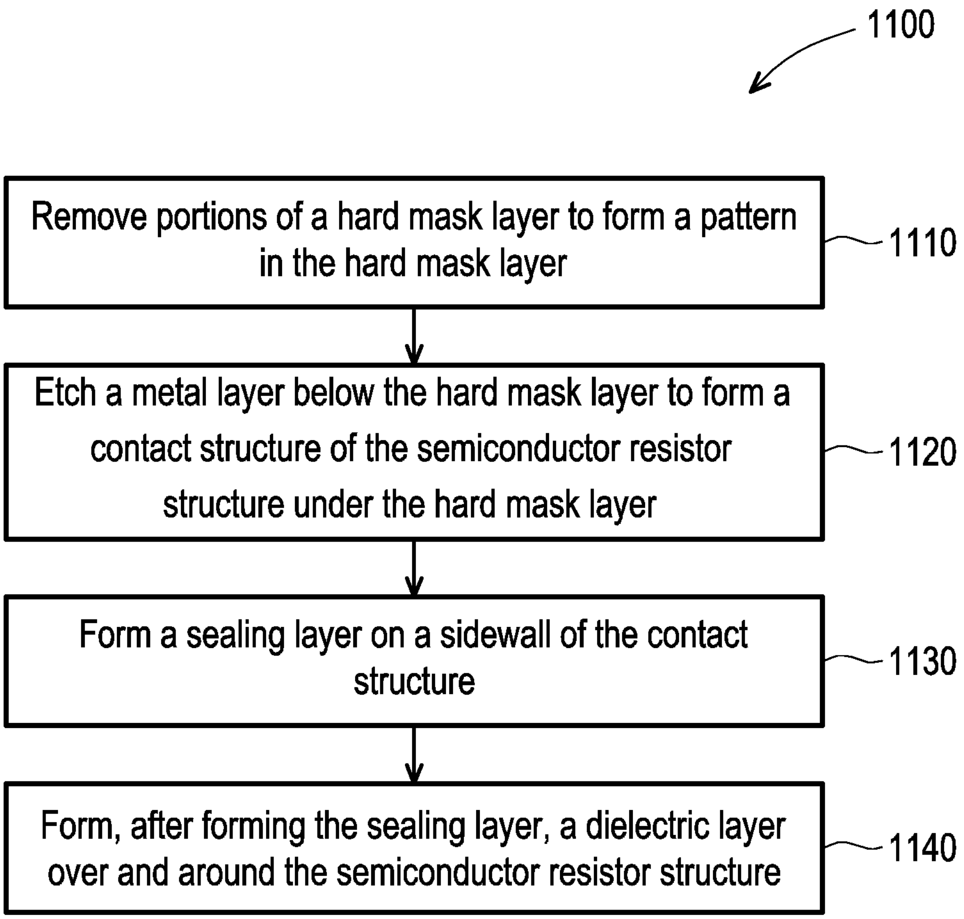
FIG. 11 is a flowchart of an example process associated with forming a semiconductor device.

FIG. 11 is a flowchart of an example process 1100 associated with forming a semiconductor device. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include removing portions of a hard mask layer to form a pattern in the hard mask layer (block 1110). For example, one or more of the semiconductor processing tools 102-112 may remove portions of a hard mask layer 806 to form a pattern in the hard mask layer 806, as described herein. In some implementations, remaining portions of the hard mask layer 806 correspond to a capping layer 274 of a semiconductor resistor structure 260.

As further shown in FIG. 11, process 1100 may include etching a conductive layer below the hard mask layer to form a contact structure of the semiconductor resistor structure under the hard mask layer (block 1120). For example, one or more of the semiconductor processing tools 102-112 may etch a conductive layer 804 below the hard mask layer 806 to form a contact structure **264*a* of the semiconductor resistor structure 260 under the hard mask layer 806, as described herein. In some implementations, a sidewall of the contact structure 264*a* is laterally etched, thereby resulting in an overhang region 808 around the contact structure 264*a* in which the capping layer 274** extends laterally outward past the sidewall of the contact structure.

As further shown in FIG. 11, process 1100 may include forming a sealing layer on the sidewall of the contact structure (block 1130). For example, one or more of the semiconductor processing tools 102-112 may form a sealing layer 276 on the sidewall of the contact structure **264*a*, as described herein. In some implementations, the sealing layer 276 occupies the overhang region 808** around the contact structure.

As further shown in FIG. 11, process 1100 may include forming, after forming the sealing layer, a dielectric layer over and around the semiconductor resistor structure (block 1140). For example, one or more of the semiconductor processing tools 102-112 may form, after forming the sealing layer 276, a dielectric layer 222 over and around the semiconductor resistor structure 260, as described herein.

Process 1100 may include additional implementations, such as any single implementation or any combination of implementations described below and/or in connection with one or more other processes described elsewhere herein.

In a first implementation, forming the sealing layer 276 includes selectively depositing the sealing layer 276 on only the sidewall of the contact structure **264*a*. In a second implementation, alone or in combination with the first implementation, forming the sealing layer 276 includes performing, using a tungsten-containing precursor (e.g., a precursor 810), an FFW deposition operation to deposit tungsten (W) on the sidewall of the contact structure 264*a*. In a third implementation, alone or in combination with one or more of the first and second implementations, etching the conductive layer 804 results in a top surface of a resistive layer 262, under the contact structure 264*a*, being exposed, and forming the sealing layer 276 includes depositing the sealing layer 276 using a precursor 810 that bonds with the sidewall of the contact structure 264*a* and that resists bonding with the top surface of the resistive layer 262**.

In a fourth implementation, alone or in combination with one or more of the first through third implementations, forming the sealing layer 276 includes performing a plurality of thermal ALD cycles to form the sealing layer 276 on the sidewall of the contact structure **264*a*. In a fifth implementation, alone or in combination with one or more of the first through fourth implementations, forming the sealing layer 276 includes depositing the sealing layer 276 using a precursor 810 that includes at least one of a tungsten chloride ($WCl_x$), a tungsten fluoride ($WF_x$), or a molybdenum chloride ($MoCl_x$). In a sixth implementation, alone or in combination with one or more of the first through fifth implementations, forming the sealing layer 276 includes forming the sealing layer 276 to substantially eliminate a likelihood of void formation in the dielectric layer 222 around the contact structure 264*a***.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a sealing layer is formed around a contact structure of a resistor in a BEOL region of a semiconductor device. The sealing layer fills in and occupies areas around the contact structure in which an overhang of a hard mask layer occurs as a result of lateral etching of the contact structure during formation of the contact structure. The sealing layer may include a material that can be selectively deposited on sidewalls of the contact structure and not on other layers and/or structures in the BEOL region. The sealing layer described herein may reduce the likelihood of void formation, in a dielectric layer of the BEOL region, that might otherwise occur due to the overhang of the hard mask layer. The reduced likelihood of void formation may enable the dielectric layer to fully fill in the areas around the resistor in the BEOL region, thereby increasing the structural integrity of the BEOL region. The increased structural integrity may reduce the likelihood of portions of the BEOL region collapsing and/or failing. Thus, the increased structural integrity may preserve functionality and/or increase performance for the semiconductor device in that the likelihood of component failure in the semiconductor device is reduced as a result of the reduced likelihood of portions of the BEOL region collapsing and/or failing. This may increase yield of semiconductor devices that include sealing layers described herein.

As described in greater detail above, some implementations described herein provide a semiconductor resistor structure. The semiconductor resistor structure includes a resistive layer. The semiconductor resistor structure includes a contact structure on the resistive layer. The semiconductor resistor structure includes a capping layer on the contact structure. The semiconductor resistor structure includes a sealing layer on a sidewall of the contact structure, where the sealing layer is between the resistive layer and an overhang portion of the capping layer, and where, in a top-down view of the semiconductor resistor structure, the sealing layer surrounds a perimeter of the contact structure.

As described in greater detail above, some implementations described herein provide a method. The method includes removing portions of a hard mask layer to form a pattern in the hard mask layer, where remaining portions of the hard mask layer correspond to a capping layer of a semiconductor resistor structure. The method includes etching a conductive layer below the hard mask layer to form a contact structure of the semiconductor resistor structure under the hard mask layer, where a sidewall of the contact structure is laterally etched, thereby resulting in an overhang region around the contact structure in which the capping layer extends laterally outward past the sidewall of the contact structure. The method includes forming a sealing layer on the sidewall of the contact structure, where the sealing layer occupies the overhang region around the contact structure. The method includes forming, after forming the sealing layer, a dielectric layer over and around the semiconductor resistor structure.

As described in greater detail above, some implementations described herein provide a semiconductor device. The semiconductor device includes a first dielectric layer. The semiconductor device includes an etch stop layer over the first dielectric layer. The semiconductor device includes a second dielectric layer over the etch stop layer, where the first dielectric layer, the etch stop layer, and the second dielectric layer are included in a back end of line (BEOL) region of the semiconductor device. The semiconductor device includes a BEOL resistor structure, included in the first dielectric layer, comprising, a resistive layer a contact structure on the resistive layer a capping layer on the contact structure, a sealing layer on a sidewall of the contact structure, where the sealing layer is between the resistive layer and an overhang portion of the capping layer an interconnect via structure in the first dielectric layer and extending into a portion of the contact structure, where a height of a top surface of the sealing layer in the semiconductor device is greater relative to a height of a bottom surface of the interconnect via in the semiconductor device a metallization layer connected with the interconnect via structure, where the metallization layer extends through the etch stop layer and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

removing portions of a hard mask layer to form a pattern in the hard mask layer, wherein remaining portions of the hard mask layer correspond to a capping layer of a semiconductor resistor structure;

etching a conductive layer below the hard mask layer to form a contact structure of the semiconductor resistor structure under the hard mask layer, wherein a sidewall of the contact structure is laterally etched, thereby resulting in an overhang region around the contact structure in which the capping layer extends laterally outward past the sidewall of the contact structure;

forming a sealing layer on the sidewall of the contact structure, wherein the sealing layer occupies the overhang region around the contact structure; and forming, after forming the sealing layer, a dielectric layer over and around the semiconductor resistor structure.

2. The method of claim 1, wherein forming the sealing layer comprises:

selectively depositing the sealing layer on only the sidewall of the contact structure.

3. The method of claim 1, wherein forming the sealing layer comprises:

performing, using a tungsten-containing precursor, a fluorine-free tungsten (FFW) deposition operation to deposit tungsten on the sidewall of the contact structure.

4. The method of claim 1, wherein etching the conductive layer results in a top surface of a resistive layer, under the contact structure, being exposed; and wherein forming the sealing layer comprises:

depositing the sealing layer using a precursor that bonds with the sidewall of the contact structure and that resists bonding with the top surface of the resistive layer.

5. The method of claim 1, wherein forming the sealing layer comprises:

performing a plurality of thermal atomic layer deposition (ALD) cycles to form the sealing layer on the sidewall of the contact structure.

6. The method of claim 1, wherein forming the sealing layer comprises:

depositing the sealing layer using a precursor that includes at least one of:

a tungsten chloride ($WCl_x$), a tungsten fluoride ($WF_x$), or a molybdenum chloride ($MoCl_x$).

7. The method of claim 1, wherein forming the sealing layer comprises:

forming the sealing layer to substantially eliminate a likelihood of void formation in the dielectric layer around the contact structure.

8. A method of forming a semiconductor device, comprising:

forming a first dielectric layer;

forming an etch stop layer over the first dielectric layer;

forming a second dielectric layer over the etch stop layer, wherein the first dielectric layer, the etch stop layer, and the second dielectric layer are included in a back end of line (BEOL) region of the semiconductor device;

forming a BEOL resistor structure, included in the first dielectric layer, comprising:

a resistive layer;

a contact structure on the resistive layer;

a capping layer on the contact structure, a sealing layer on a sidewall of the contact structure, wherein the sealing layer is between the resistive layer and an overhang portion of the capping layer, and wherein the sealing layer is included on four sides of the contact structure;

an interconnect via structure in the first dielectric layer and extending into a portion of the contact structure, wherein a height of a top surface of the sealing layer in the semiconductor device is greater relative to a height of a bottom surface of the interconnect via in the semiconductor device; and a metallization layer connected with the interconnect via structure, wherein the metallization layer extends through the etch stop layer and the second dielectric layer.

9. The method of claim 8,
wherein the sealing layer is continuous around a perimeter of the contact structure.

10. The method of claim 8,
wherein the sealing layer includes a convex outer sidewall.

11. The method of claim 8,
wherein a thickness of the sealing layer and a thickness of the contact structure are approximately a same thickness.

12. The method of claim 8,
wherein the sealing layer comprises at least one of:
tungsten (W), or
molybdenum (Mo).

13. The method of claim 8,
wherein a width of the sealing layer increases along a thickness of the sealing layer from the capping layer to the resistive layer.

14. The method of claim 8,
wherein a width of the sealing layer increases along a thickness of the sealing layer from the resistive layer to the capping layer.

15. A method of forming a semiconductor device, comprising:
forming a first dielectric layer;
forming an etch stop layer over the first dielectric layer;
forming a second dielectric layer over the etch stop layer,
wherein the first dielectric layer, the etch stop layer, and the second dielectric layer are included in a back end of line (BEOL) region of the semiconductor device;
forming a BEOL resistor structure, included in the first dielectric layer, comprising:
a resistive layer,
a contact structure on the resistive layer,
a capping layer on the contact structure,
a sealing layer on a sidewall of the contact structure,
wherein the sealing layer is between the resistive layer and an overhang portion of the capping layer, and
wherein the sealing layer comprises at least one of:
tungsten (W), or
molybdenum (Mo;
an interconnect via structure in the first dielectric layer and extending into a portion of the contact structure,
wherein a height of a top surface of the sealing layer in the semiconductor device is greater relative to a height of a bottom surface of the interconnect via in the semiconductor device; and
a metallization layer connected with the interconnect via structure,
wherein the metallization layer extends through the etch stop layer and the second dielectric layer.

16. The method of claim 15,
wherein the sealing layer is continuous around a perimeter of the contact structure.

17. The method of claim 15,
wherein the sealing layer is included on four sides of the contact structure.

18. The method of claim 15,
wherein the sealing layer includes a convex outer sidewall.

19. The method of claim 15,
wherein a thickness of the sealing layer and a thickness of the contact structure are approximately a same thickness.

20. The method of claim 15,
wherein an overhang portion of the capping layer comprises a portion of the capping layer that extends laterally outward from the sidewall of the contact structure.

* * * * *